(12) United States Patent
Wang et al.

(10) Patent No.: US 11,790,994 B2
(45) Date of Patent: Oct. 17, 2023

(54) NON-VOLATILE MEMORY WITH REVERSE STATE PROGRAM

(71) Applicant: Western Digital Technologies, Inc., San Jose, CA (US)

(72) Inventors: Ming Wang, Shanghai (CN); Liang Li, Shanghai (CN); Jiahui Yuan, Fremont, CA (US)

(73) Assignee: Western Digital Technologies, Inc., San Jose, CA (US)

(*) Notice: Subject to any disclaimer, the term of this patent is extended or adjusted under 35 U.S.C. 154(b) by 206 days.

(21) Appl. No.: 17/481,575

(22) Filed: Sep. 22, 2021

(65) Prior Publication Data

US 2023/0091314 A1    Mar. 23, 2023

(51) Int. Cl.
| | |
|---|---|
| *G11C 11/34* | (2006.01) |
| *G11C 16/10* | (2006.01) |
| *G11C 16/30* | (2006.01) |
| *G11C 16/08* | (2006.01) |
| *G11C 16/26* | (2006.01) |

(52) U.S. Cl.
CPC ............ *G11C 16/102* (2013.01); *G11C 16/08* (2013.01); *G11C 16/26* (2013.01); *G11C 16/30* (2013.01)

(58) Field of Classification Search
CPC ......... G11C 16/10; G11C 16/30; G11C 16/12; G11C 16/0483; H01L 27/115
USPC ........................................ 365/185.18, 185.19
See application file for complete search history.

(56) References Cited

U.S. PATENT DOCUMENTS

| | | | |
|---|---|---|---|
| 7,173,859 B2 | 2/2007 | Hemink | |
| 9,099,202 B2 | 8/2015 | Mihnea et al. | |
| 10,068,656 B2 | 9/2018 | Dutta et al. | |
| 10,510,413 B1 | 12/2019 | Diep et al. | |
| 10,748,627 B2 | 8/2020 | Chen et al. | |
| 2008/0253181 A1* | 10/2008 | Edahiro ............. | G11C 16/3418 365/185.17 |
| 2009/0073763 A1 | 3/2009 | Hosono | |
| 2009/0292860 A1* | 11/2009 | Park .................... | G11C 11/5628 711/E12.008 |
| 2018/0068739 A1 | 3/2018 | Shiino et al. | |
| 2019/0088343 A1 | 3/2019 | Miccoli et al. | |
| 2020/0258585 A1 | 8/2020 | Lee et al. | |
| 2020/0342947 A1 | 10/2020 | Li et al. | |

OTHER PUBLICATIONS

PCT International Search Report and Written Opinion dated Oct. 21, 2022, PCT Patent Application No. PCT/US2022/028245.

* cited by examiner

*Primary Examiner* — Son T Dinh
(74) *Attorney, Agent, or Firm* — Vierra Magen Marcus LLP

(57) ABSTRACT

A memory system separately programs memory cells connected by a common word line to multiple sets of data states with the set of data states having higher threshold voltage data states being programmed before the set of data states having lower threshold voltage data states. The memory system also separately programs memory cells connected by an adjacent word line to the multiple sets of data states such that memory cells connected by the adjacent word line are programmed to higher data states after memory cells connected by the common word line are programmed to higher data states and prior to memory cells connected by the common word line are programmed to lower data states.

20 Claims, 36 Drawing Sheets

Figure 4C
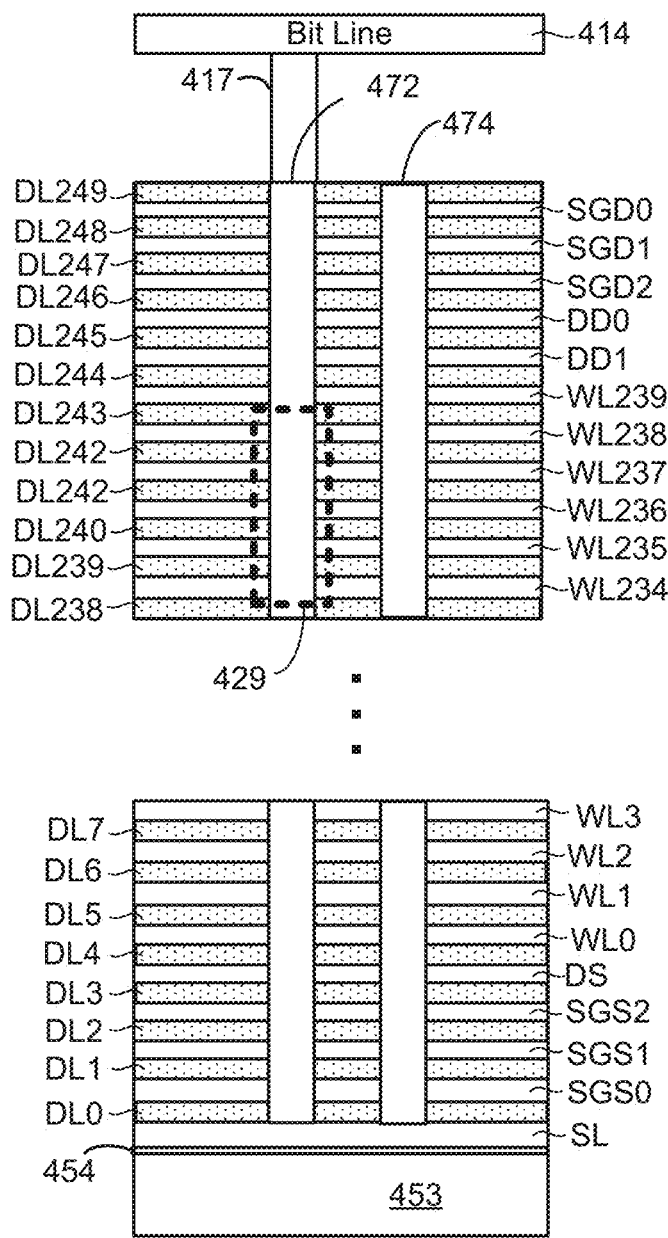
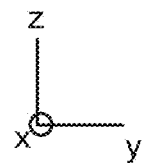

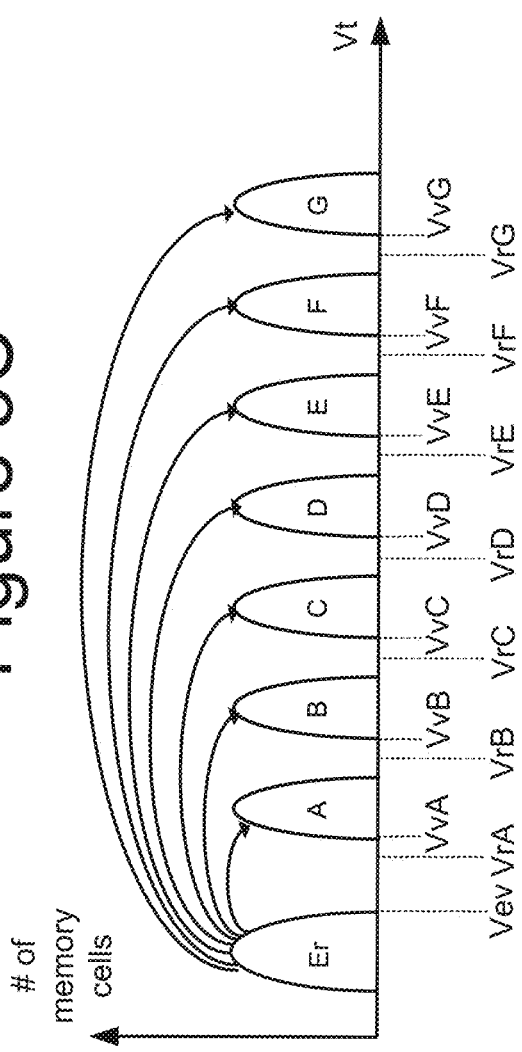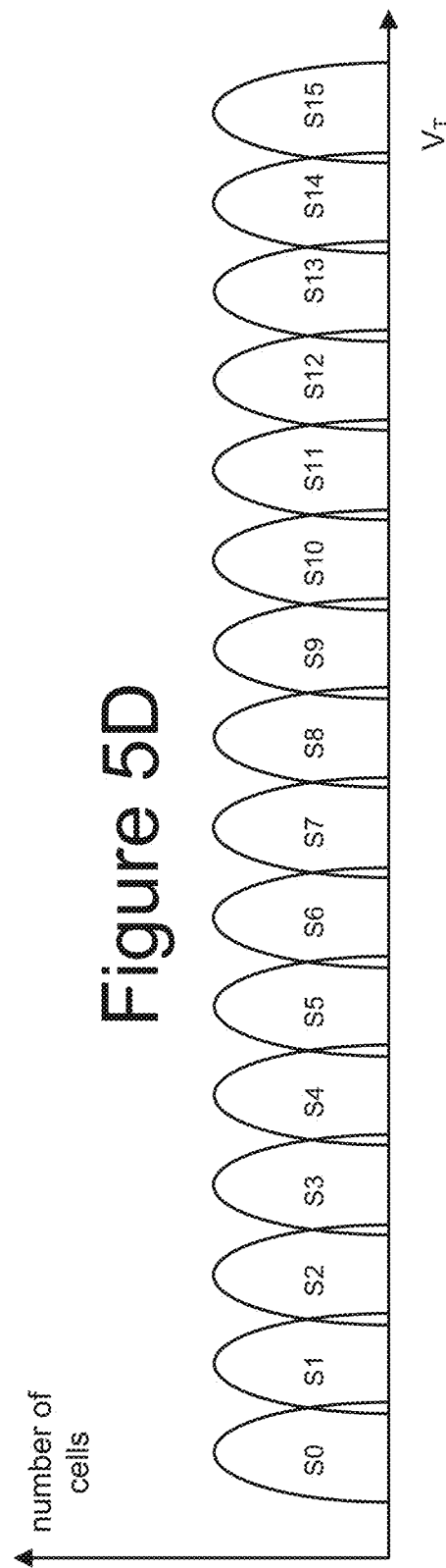

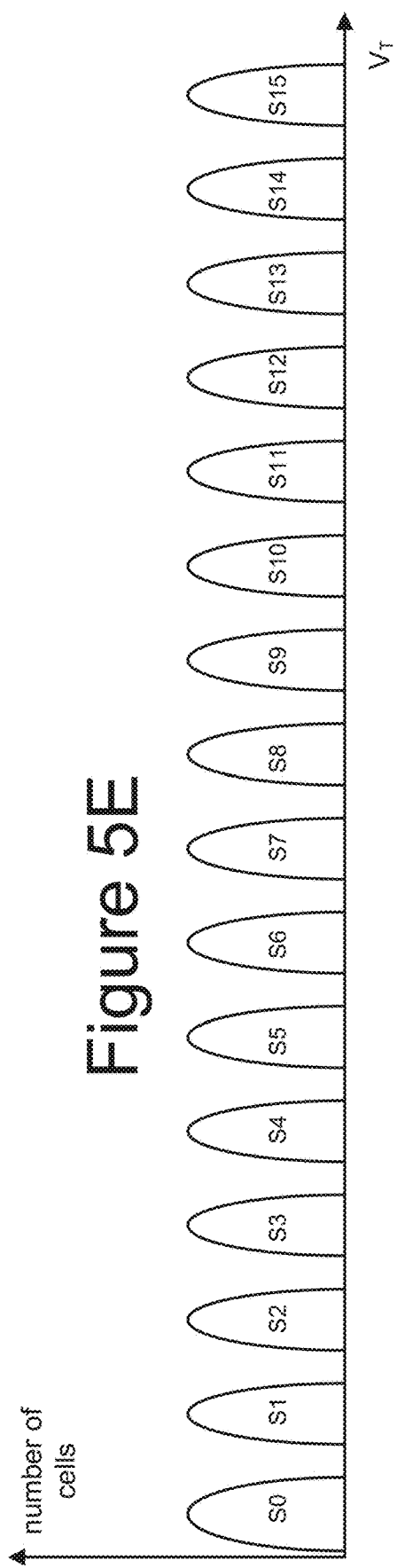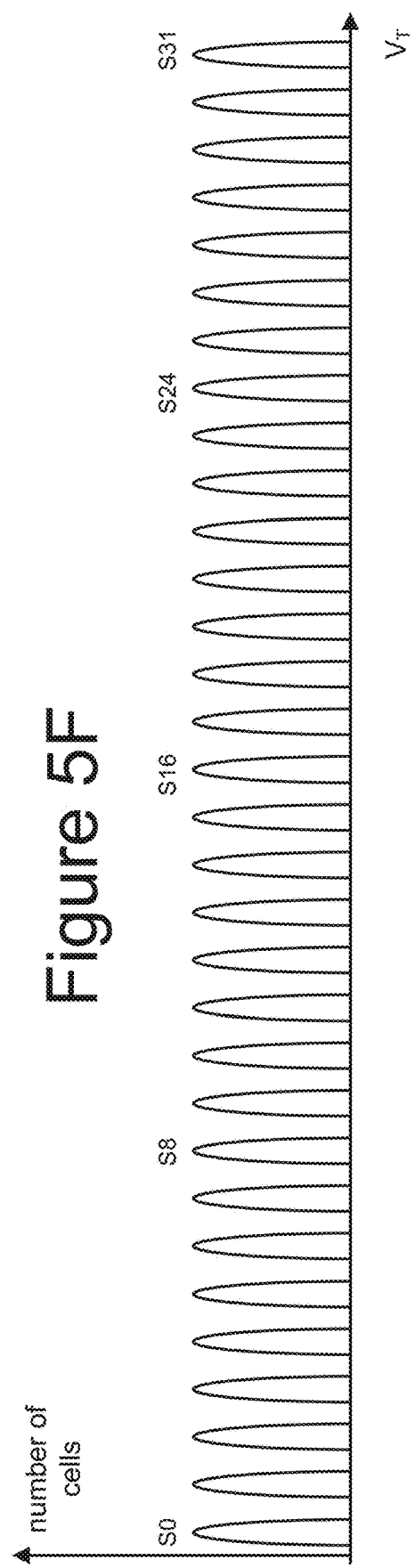

WLn program

WLn+1 program

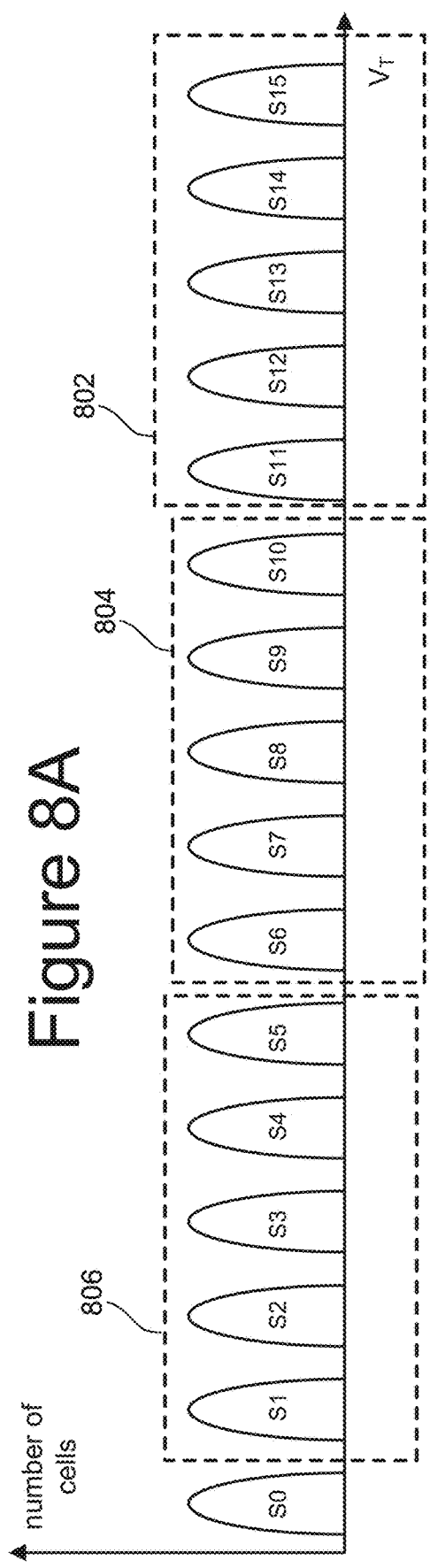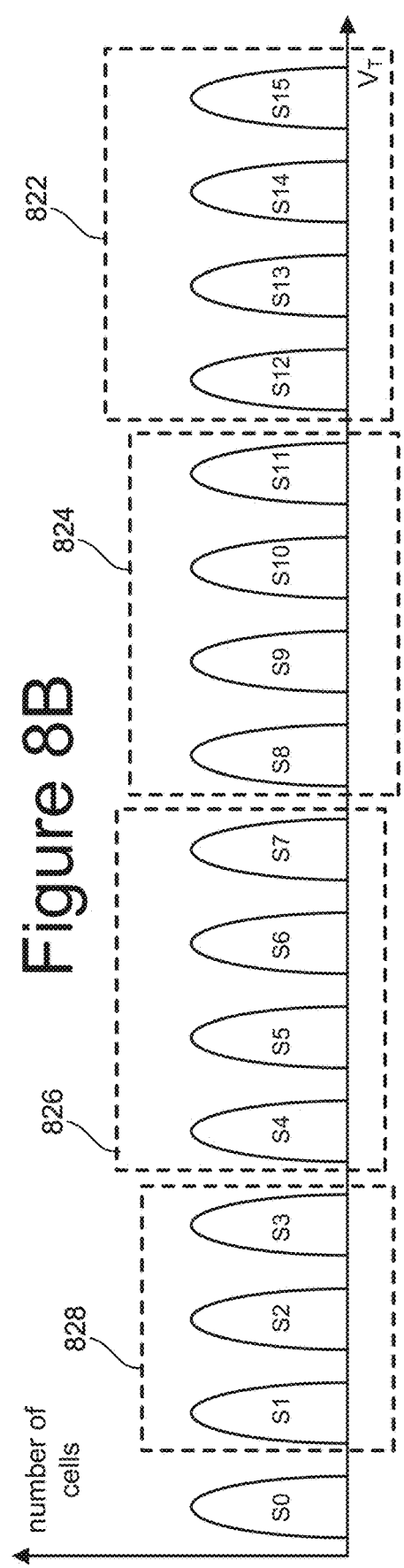

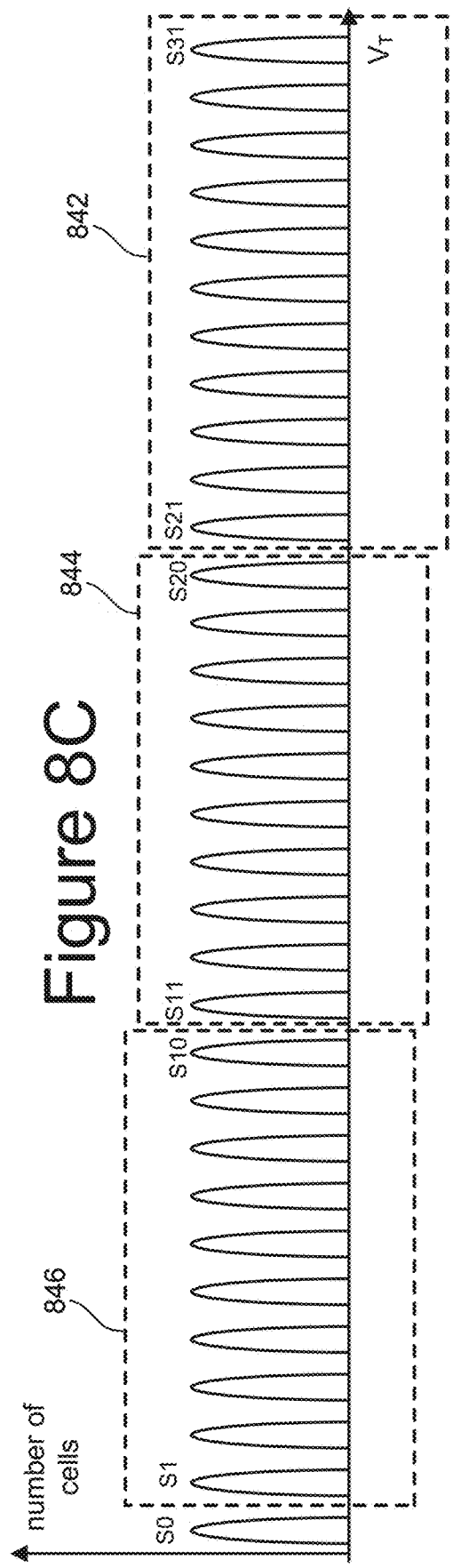

Figure 9

900
- complete programming to a first set of data states prior to starting programming to a second set of data states for non-volatile memory cells connected to a first word line of the set of word lines, the first set of data states are higher in threshold voltage than the second set of data states
  - 902: apply first voltage pulses to the first word line to program to the first set of data states the non-volatile memory cells connected to the first word line, the first voltage pulses have an initial magnitude at a first voltage
  - 904: apply a first pass voltage to unselected word lines while applying the first voltage pulses to the first word line to program to the first set of data states the non-volatile memory cells connected to the first word line

910
- complete programming to the second set of data states prior to starting programming to a third set of data states for the non-volatile memory cells connected to the first word line, the second set of data states are higher in threshold voltage than the third set of data states
  - 912: apply second voltage pulses to the first word line to program to the second set of data states the non-volatile memory cells connected to the first word line, the second voltage pulses have an initial magnitude at a second voltage, the second voltage is less than the first voltage
  - 914: apply a second pass voltage to the unselected word line while applying the second voltage pulses to the first word line to program to the second set of data states the non-volatile memory cells connected to the first word line, the second pass voltage is lower than the first pass voltage

920
- perform programming to the third set of data states for the non-volatile memory cells connected to the first word line
  - 922: apply third voltage pulses to the first word line to program to the third set of data states the non-volatile memory cells connected to the first word line, the third voltage pulses have an initial magnitude at a third voltage, the third voltage is less than the second voltage
  - 924: apply a third pass voltage to the unselected word line while applying the third voltage pulses to the first word line to program to the third set of data states the non-volatile memory cells connected to the first word line, the third pass voltage is lower than the second pass voltage

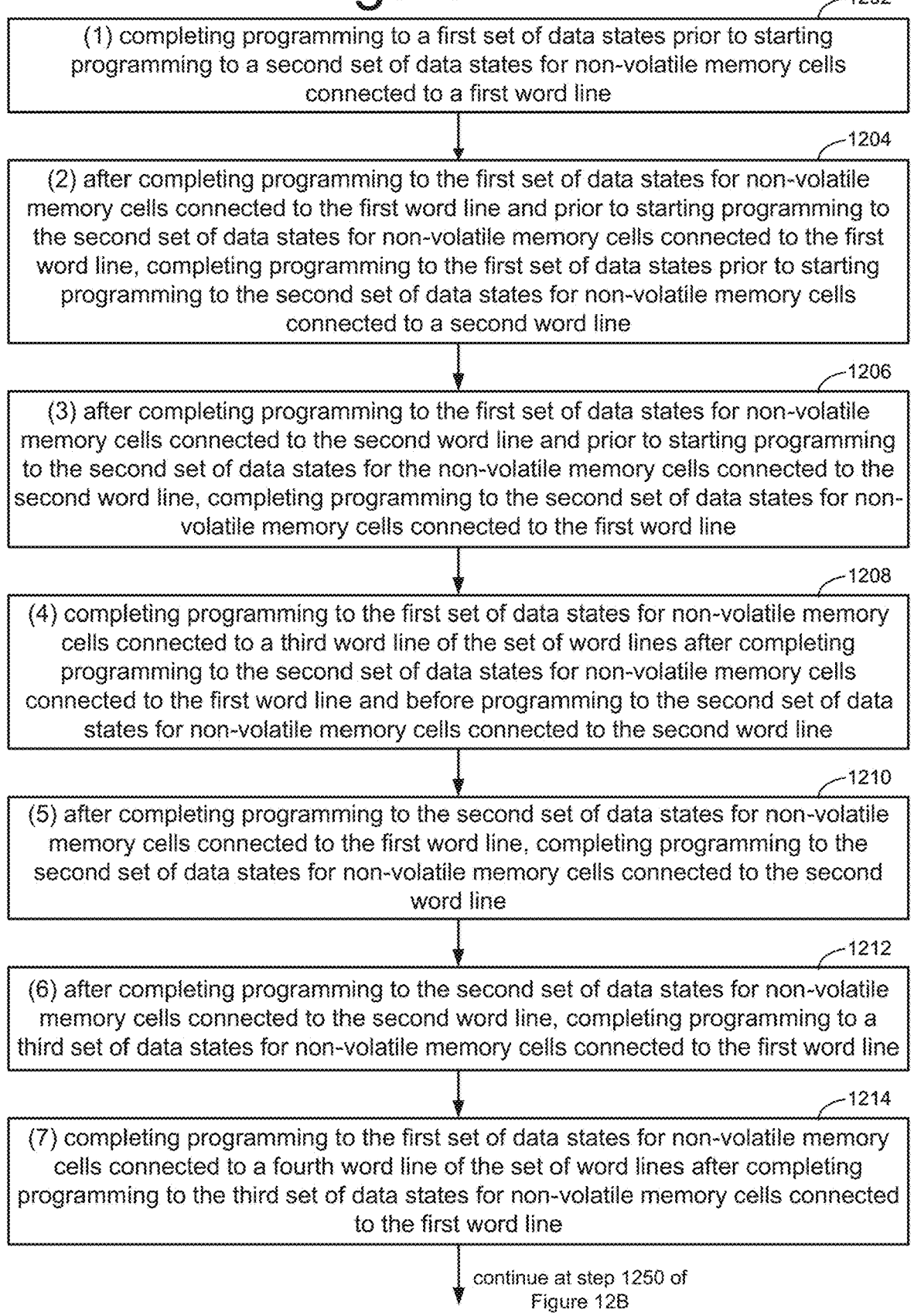

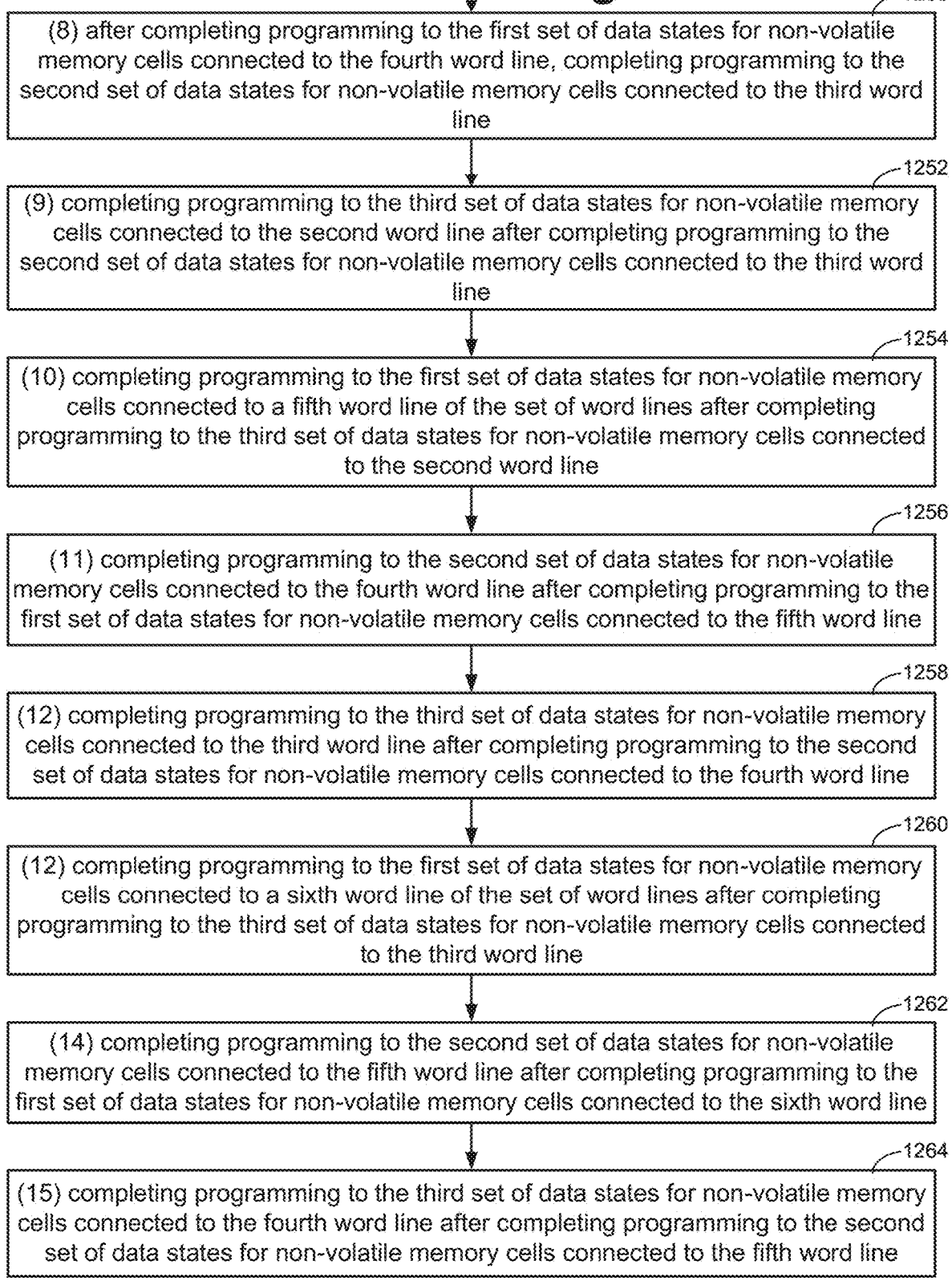

Figure 13A (WL0)
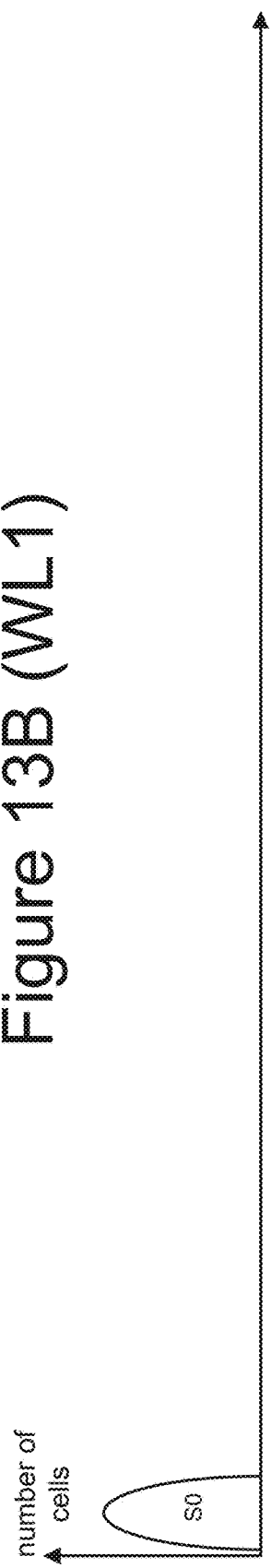
Figure 13B (WL1)
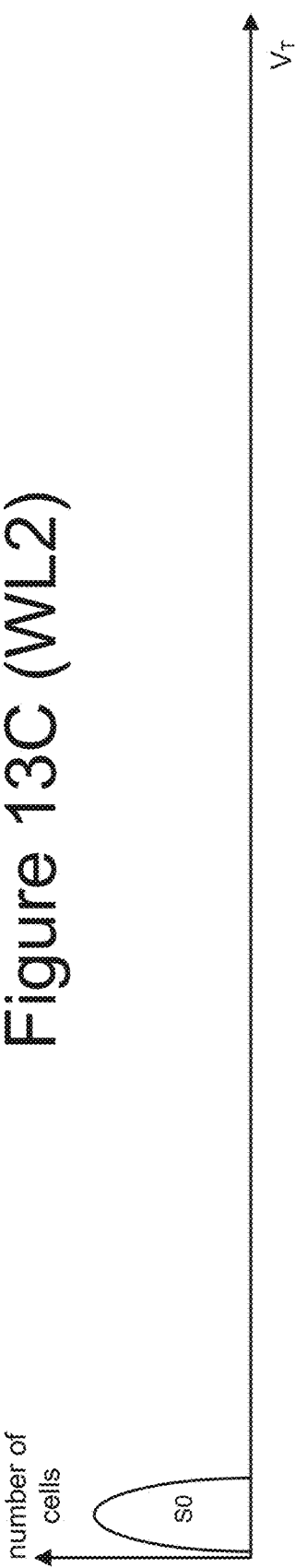
Figure 13C (WL2)

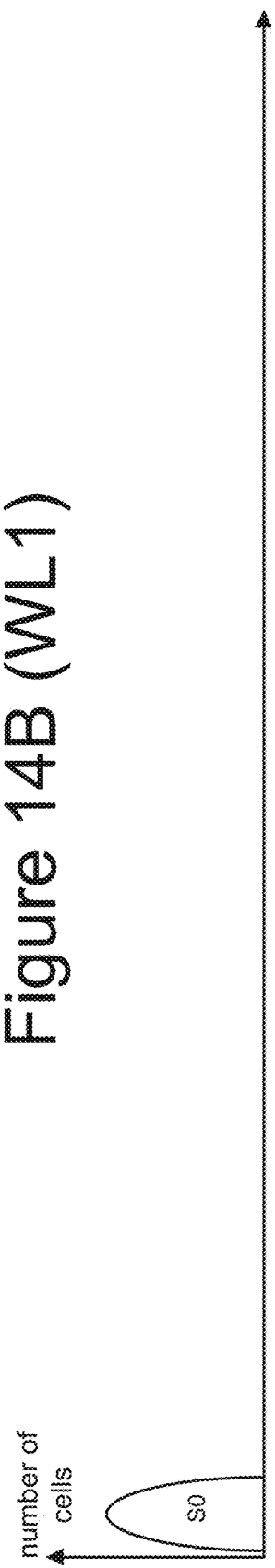

Figure 15A (WL0)
Figure 15B (WL1)
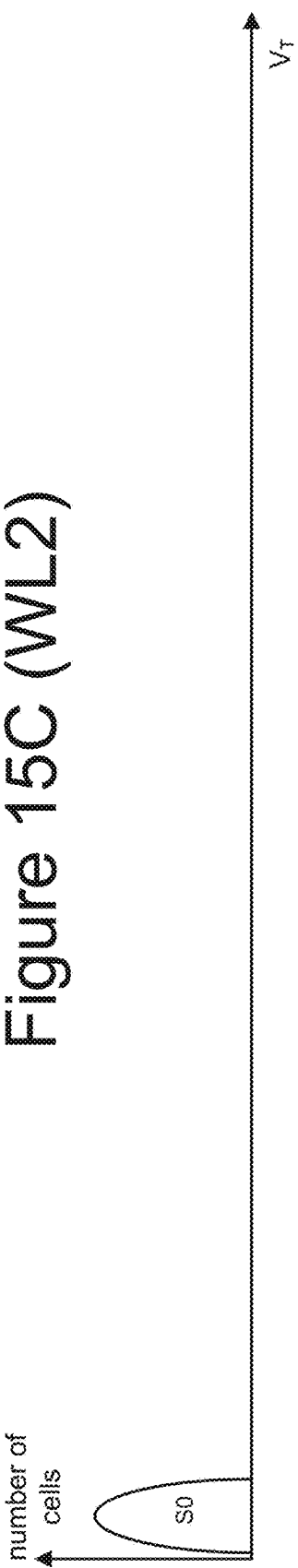
Figure 15C (WL2)

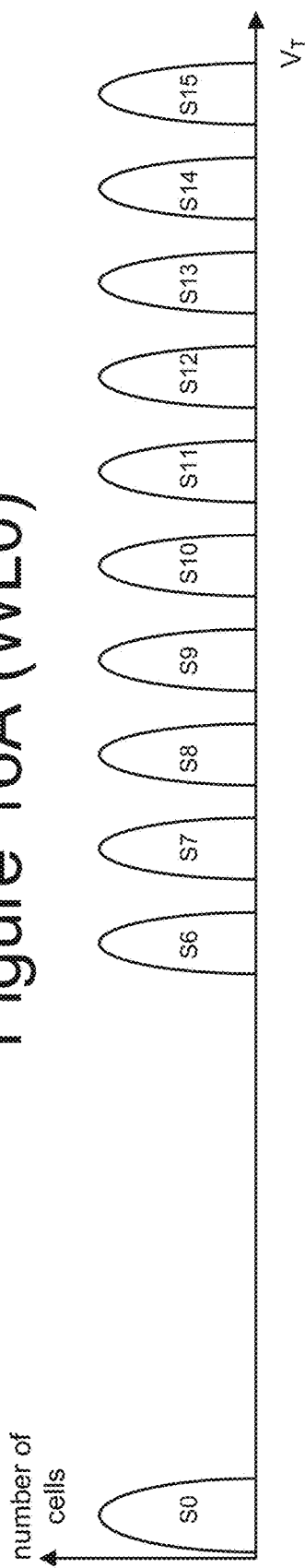
Figure 16A (WL0)
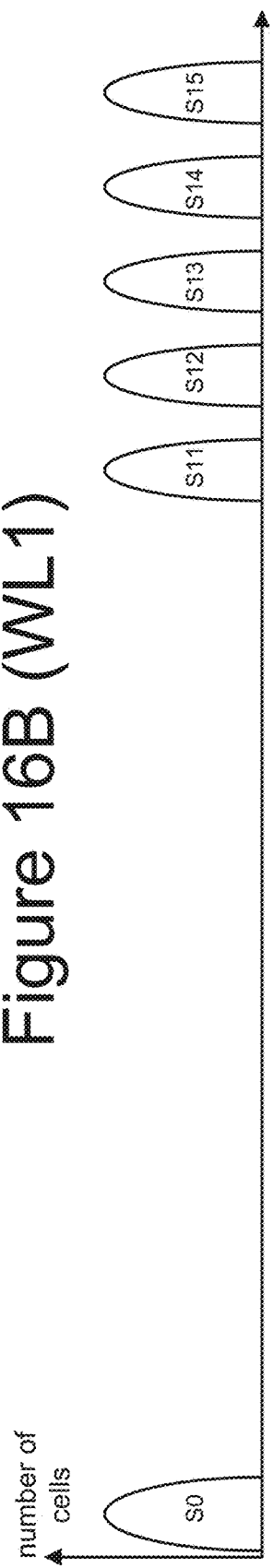
Figure 16B (WL1)
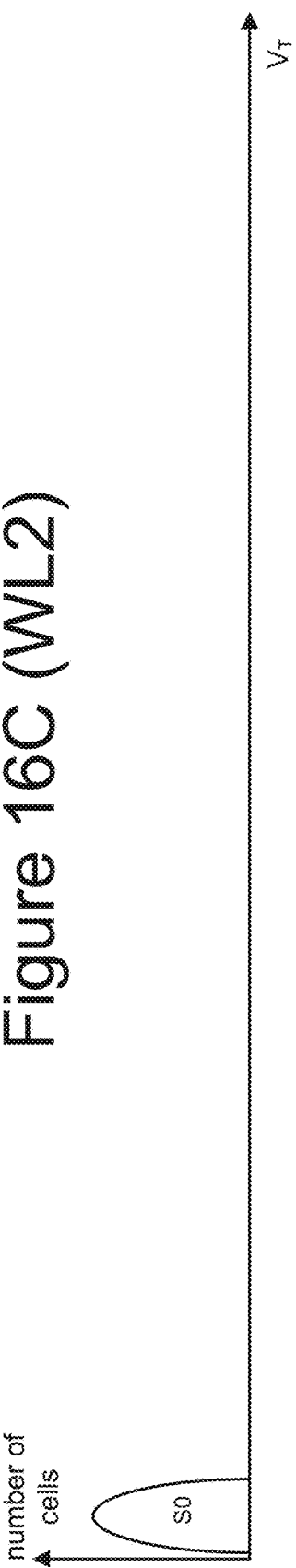
Figure 16C (WL2)

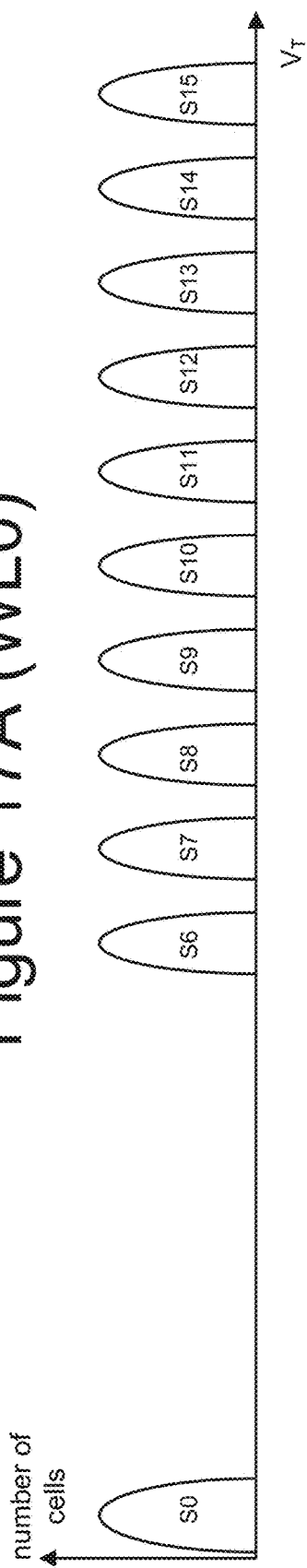
Figure 17A (WL0)
Figure 17B (WL1)
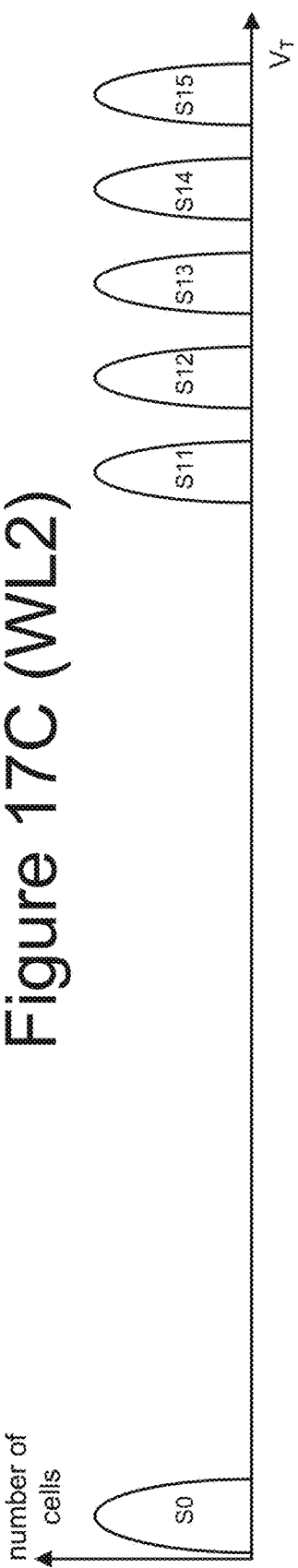
Figure 17C (WL2)

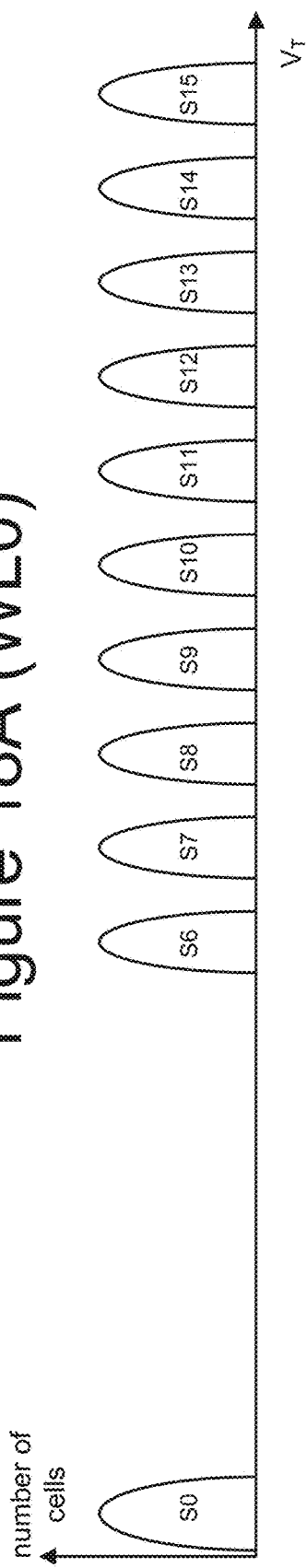
Figure 18A (WL0)
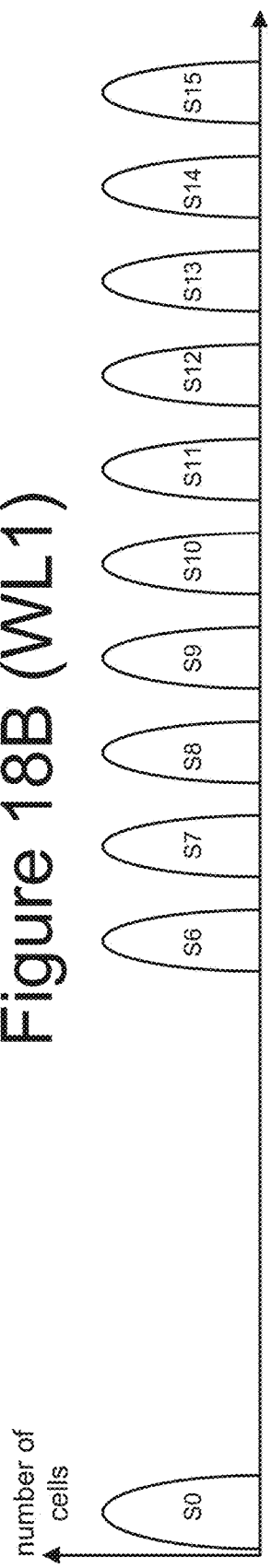
Figure 18B (WL1)
Figure 18C (WL2)

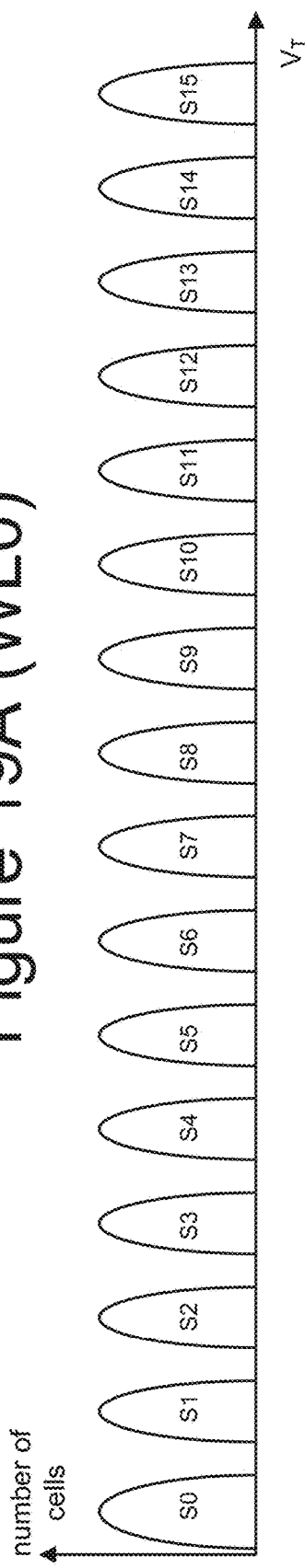
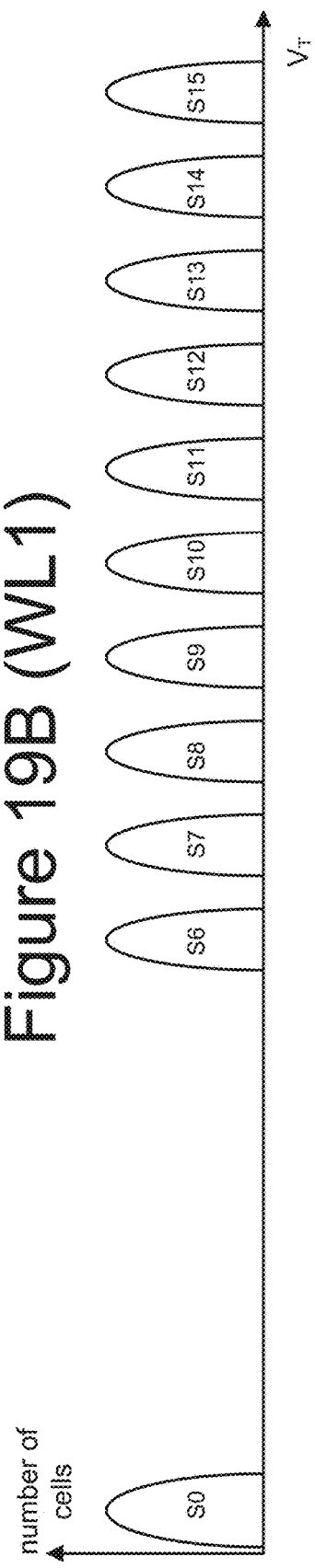
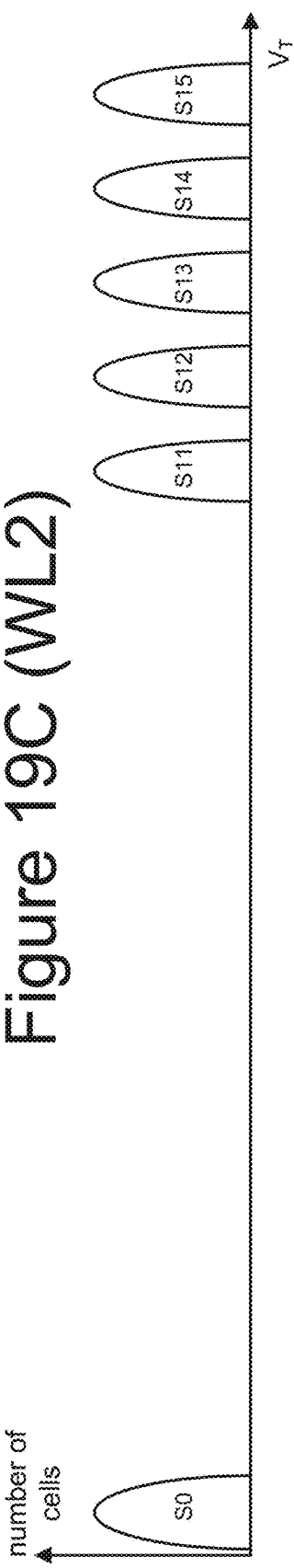

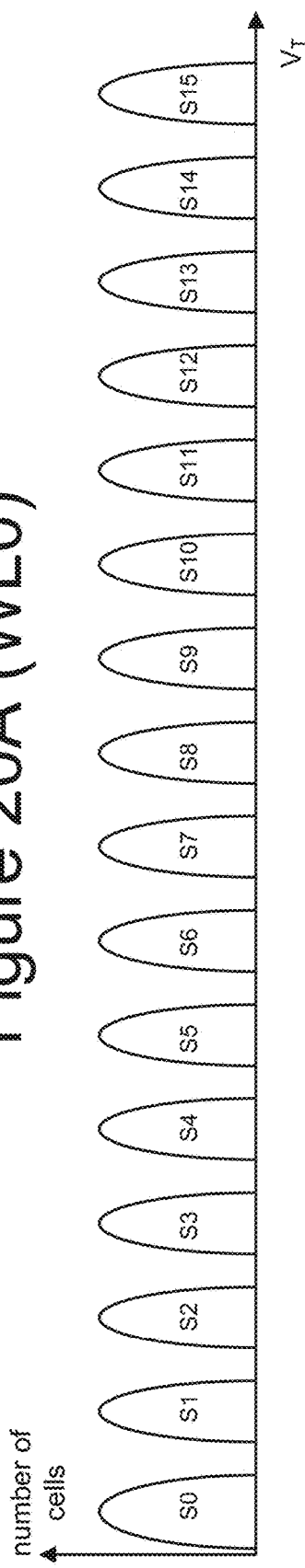
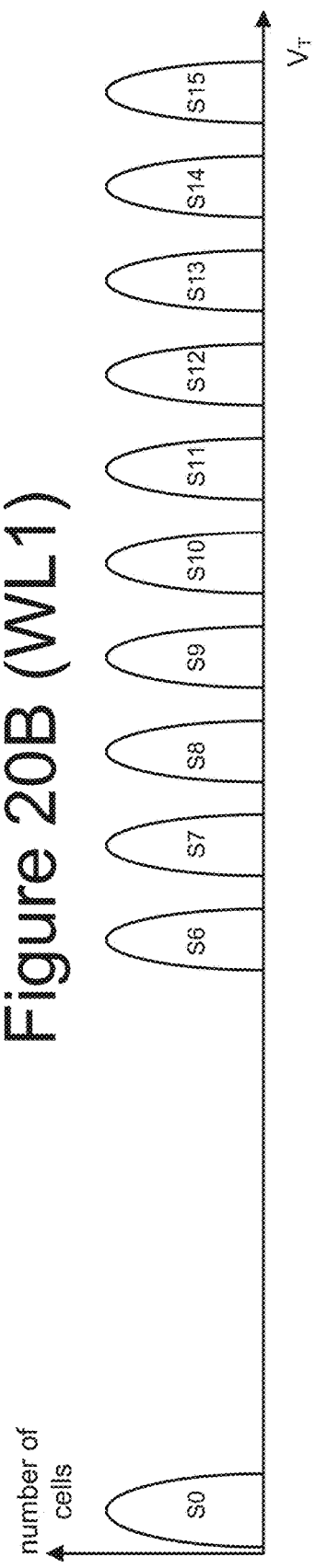
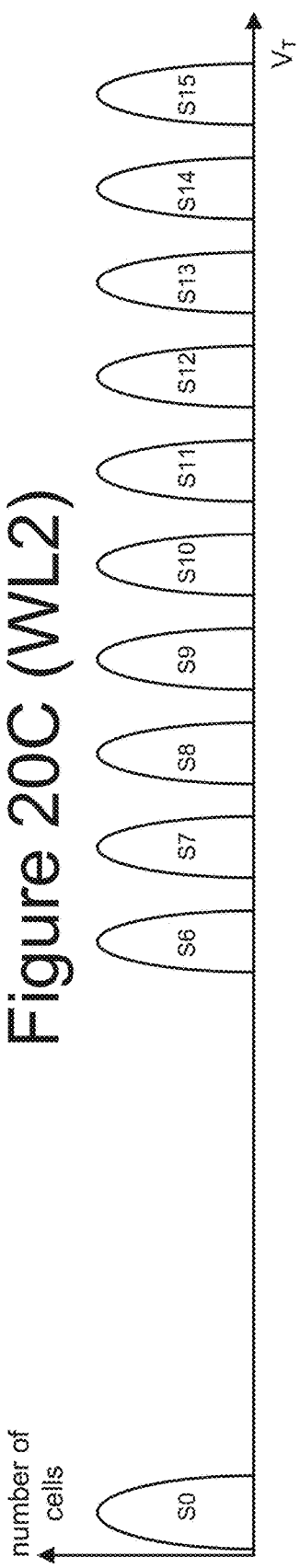

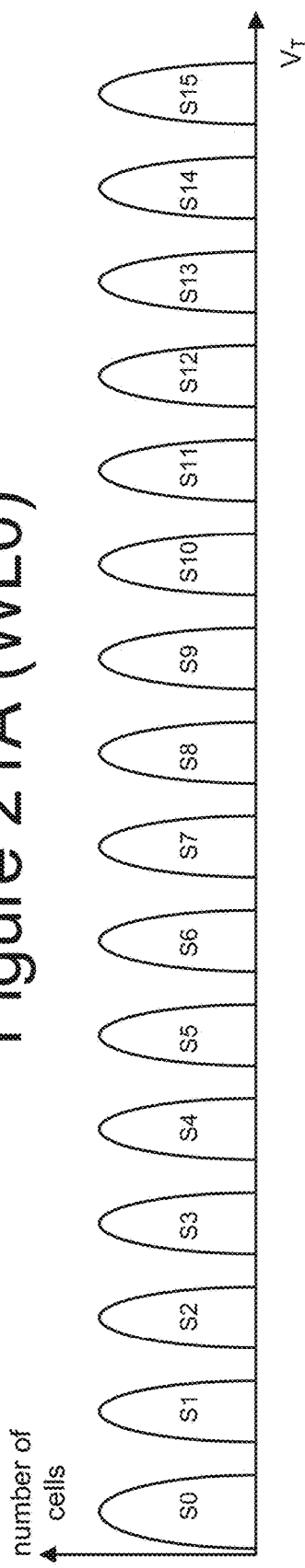
Figure 21A (WL0)
Figure 21B (WL1)
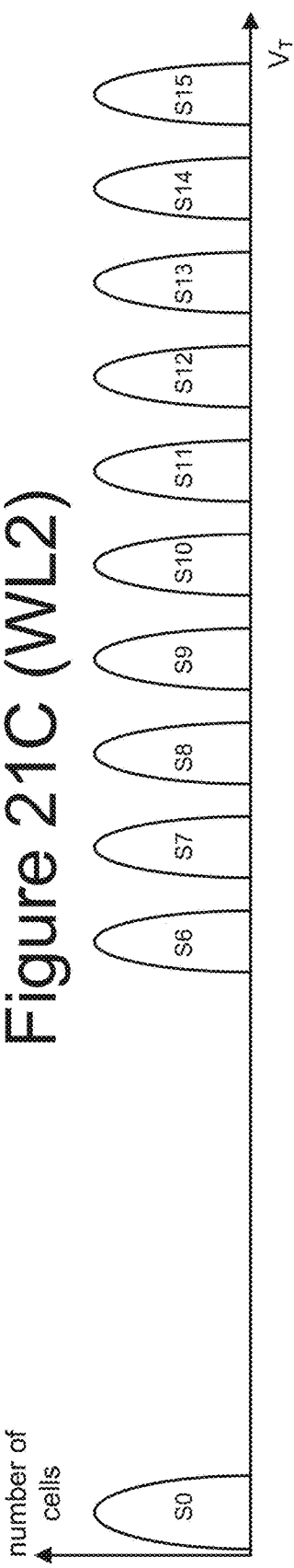
Figure 21C (WL2)

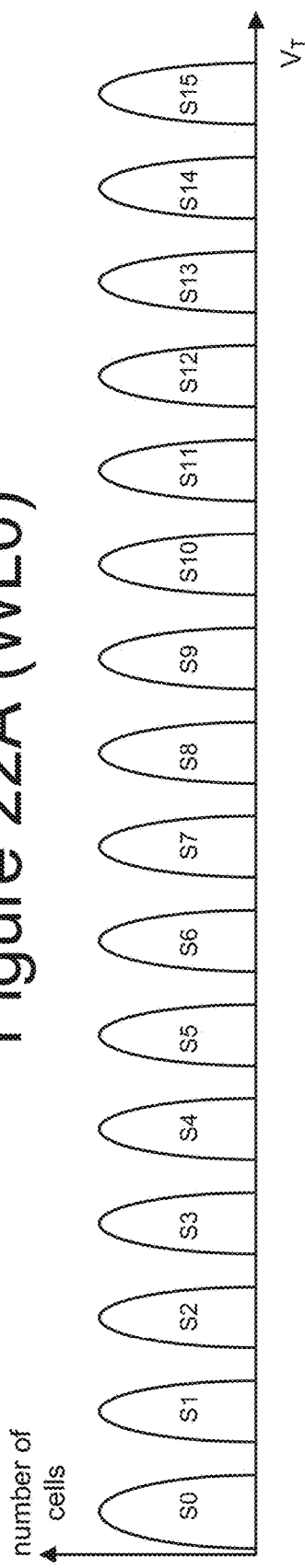
Figure 22A (WL0)
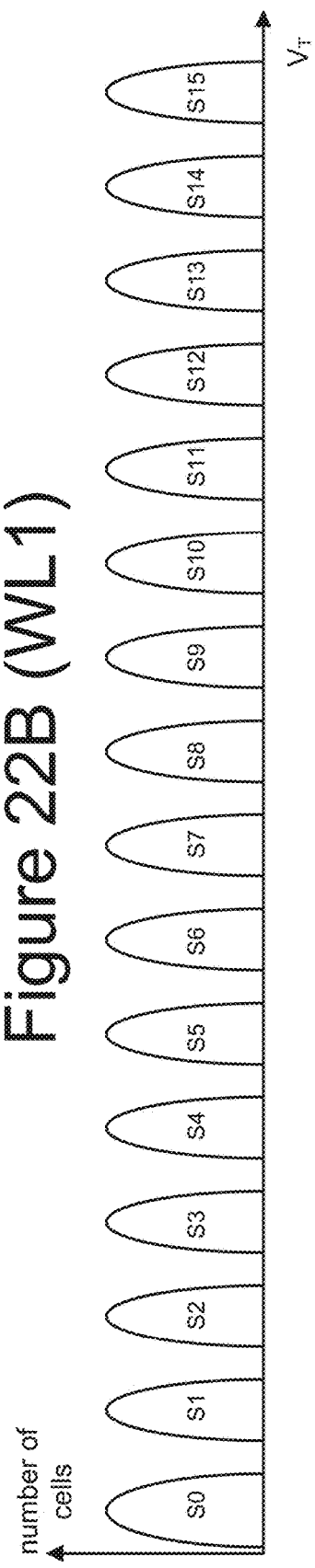
Figure 22B (WL1)
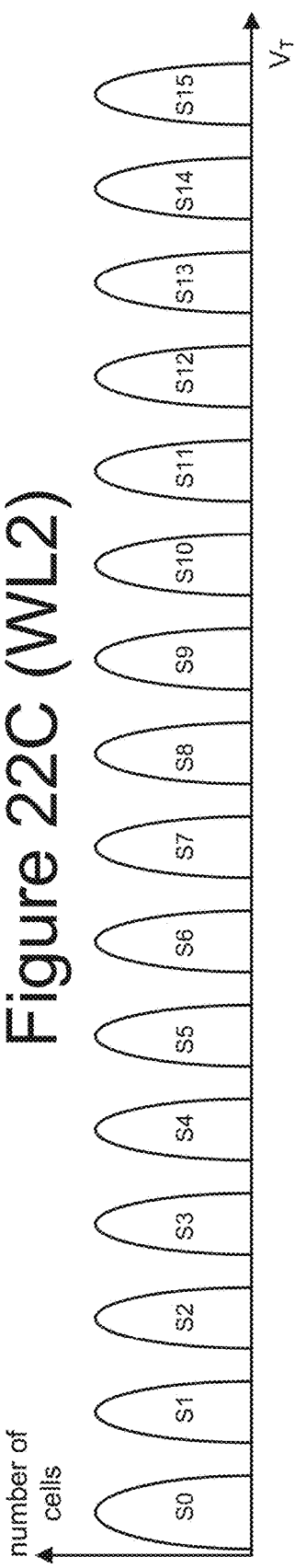
Figure 22C (WL2)

Figure 23

| WL# | 3rd set of data states | 2nd set of data states | 1st set of data states |
|-----|------------------------|------------------------|------------------------|
| WL0 | 6 | 3 | 1 |
| WL1 | 9 | 5 | 2 |
| WL2 | 12 | 8 | 4 |
| WL3 | 15 | 11 | 7 |
| WL4 | 18 | 14 | 10 |
| WL5 | 21 | 17 | 13 |
| . | . | . | . |
| . | . | . | . |
| . | . | . | . |

Figure 24

| WL# | 3rd set of data states | 2nd set of data states | 1st set of data states |
|-----|------------------------|------------------------|------------------------|
| WL239 | 6 | 3 | 1 |
| WL238 | 9 | 5 | 2 |
| WL237 | 12 | 8 | 4 |
| WL236 | 15 | 11 | 7 |
| WL235 | 18 | 14 | 10 |
| WL234 | 21 | 17 | 13 |
| . | . | . | . |
| . | . | . | . |
| . | . | . | . |

NON-VOLATILE MEMORY WITH REVERSE STATE PROGRAM

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

BRIEF DESCRIPTION OF THE DRAWINGS

Like-numbered elements refer to common components in the different figures.

FIG. 4C depicts a cross sectional view of a portion of one embodiment of a block of memory cells.

FIG. 5C depicts threshold voltage distributions.

FIG. 5D depicts threshold voltage distributions.

FIG. 5E depicts threshold voltage distributions.

FIG. 5F threshold voltage distributions.

FIG. 8A depicts threshold voltage distributions divided into set of data states.

FIG. 8B depicts threshold voltage distributions divided into set of data states.

FIG. 8C depicts threshold voltage distributions divided into set of data states.

FIG. 9 is a flow chart describing one embodiment of a process for programming non-volatile memory.

FIGS. 12A and 12B together are a flow chart describing one embodiment of a process for programming non-volatile memory.

FIGS. 13A-C, 14A-C, 15A-C, 16A-C, 17A-C, 18A-C, 19A-C, 20A-C, 21A-C, and 22A-C depict threshold voltage distributions.

FIG. 23 is a table describing an example order of programming for a group of word lines in a same block.

FIG. 24 is a table describing an example order of programming for a group of word lines in a same block.

DETAILED DESCRIPTION

One issue that poses a challenge for non-volatile memory systems is neighbor word line interference, which is defined as a shift in the amount of charge stored by memory cells connected to a common word line after programming memory cells connected to another word line that is adjacent to (e.g., a neighbor of) the common word line. In some cases the shift in charge could change the data being stored. Therefore, it is proposed to program memory cells connected by a common word line to multiple sets of data states with the set of data states having higher threshold voltage data states being programmed before the set of data states having lower threshold voltage data states. The memory system also separately programs memory cells connected by an adjacent word line to the multiple sets of data states such that memory cells connected by the adjacent word line are programmed to higher data states after memory cells connected by the common word line are programmed to higher data states and prior to memory cells connected by the common word line are programmed to lower data states. More details are provided below.

Figure 1:
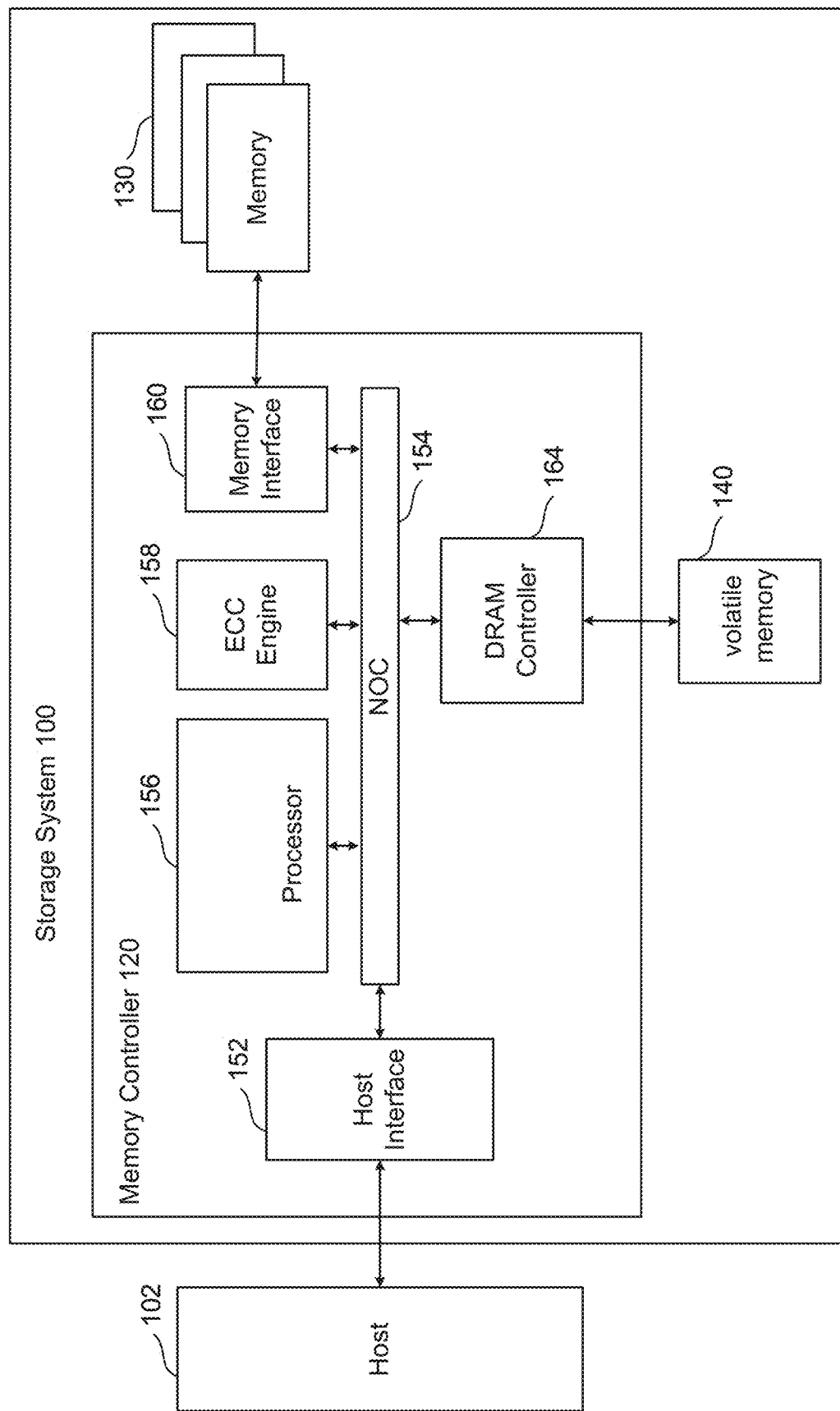
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
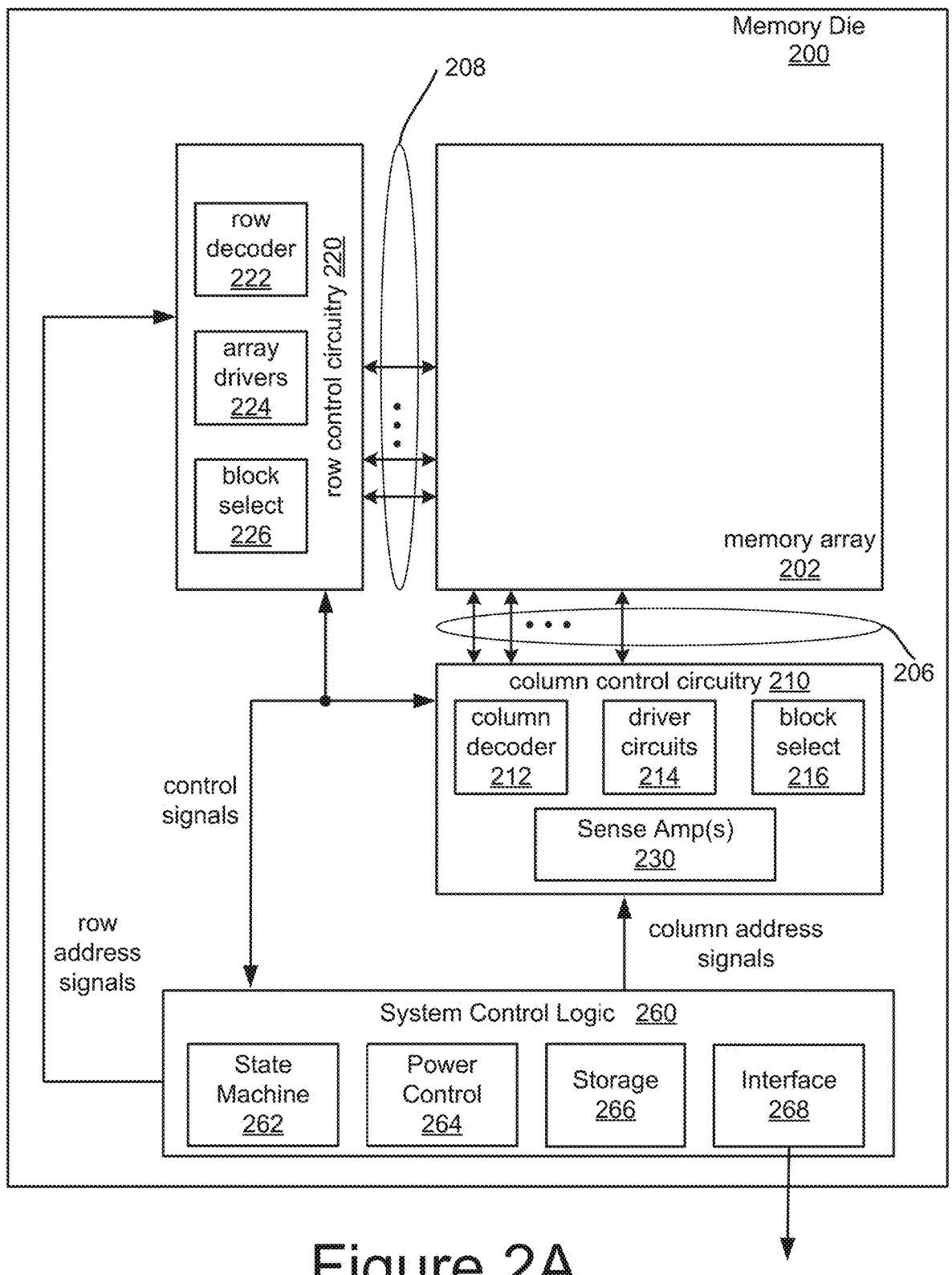
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 360, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 302 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the components depicted in FIG. 2A other than memory structure 202. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 302 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
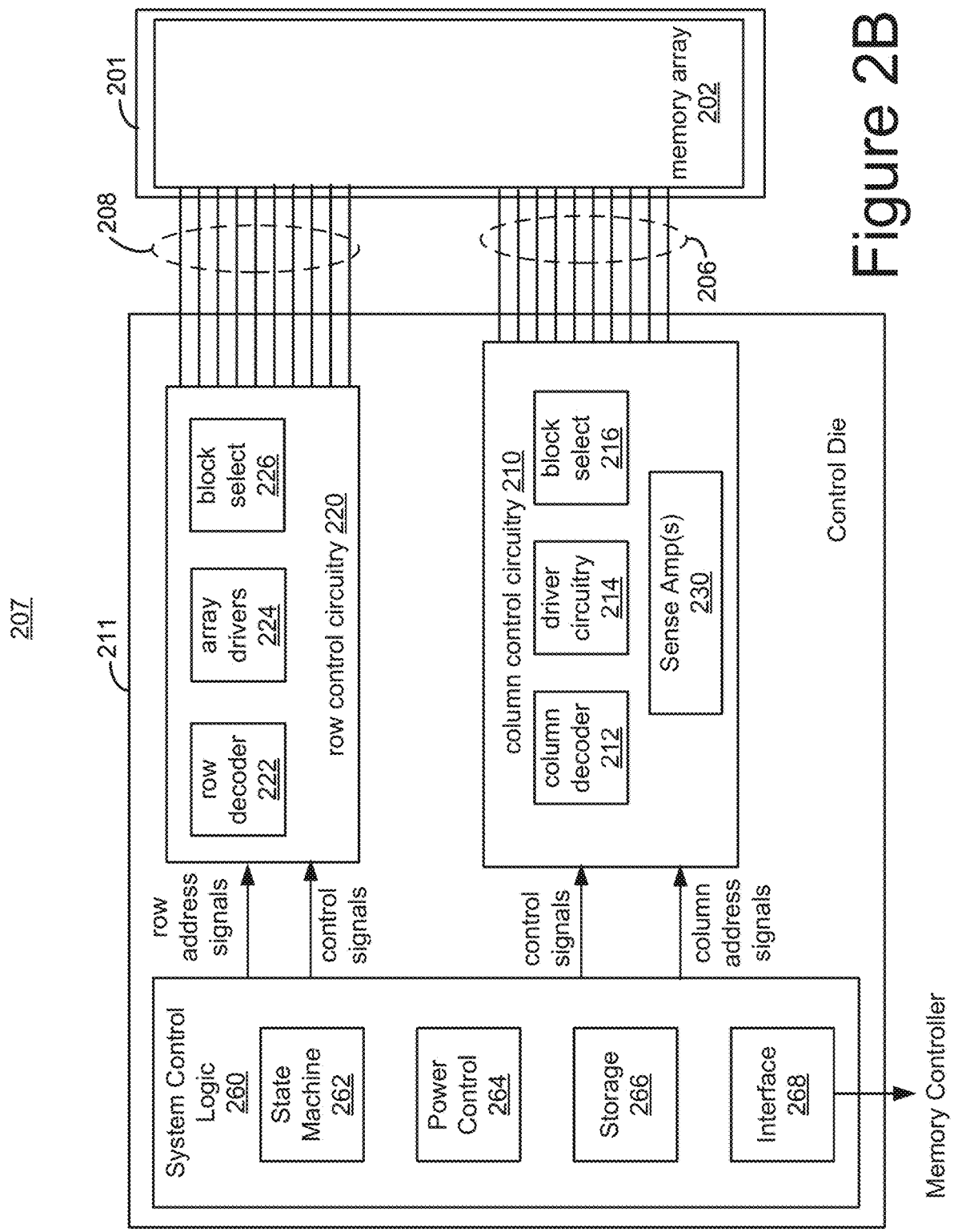
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 307 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 311 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 311 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 2C:
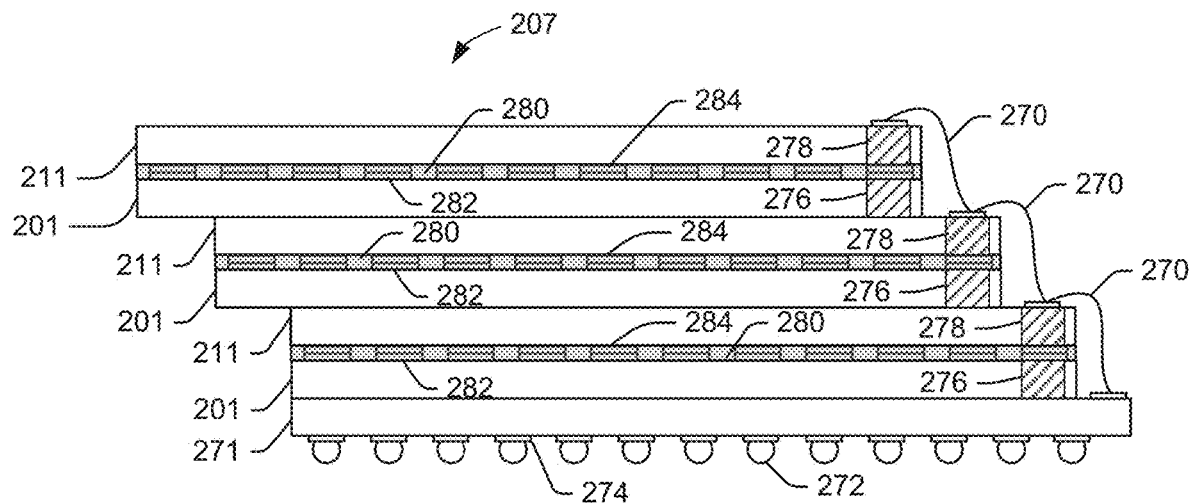
FIGS. 2C and 2D depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 2C depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 2C).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 2D:
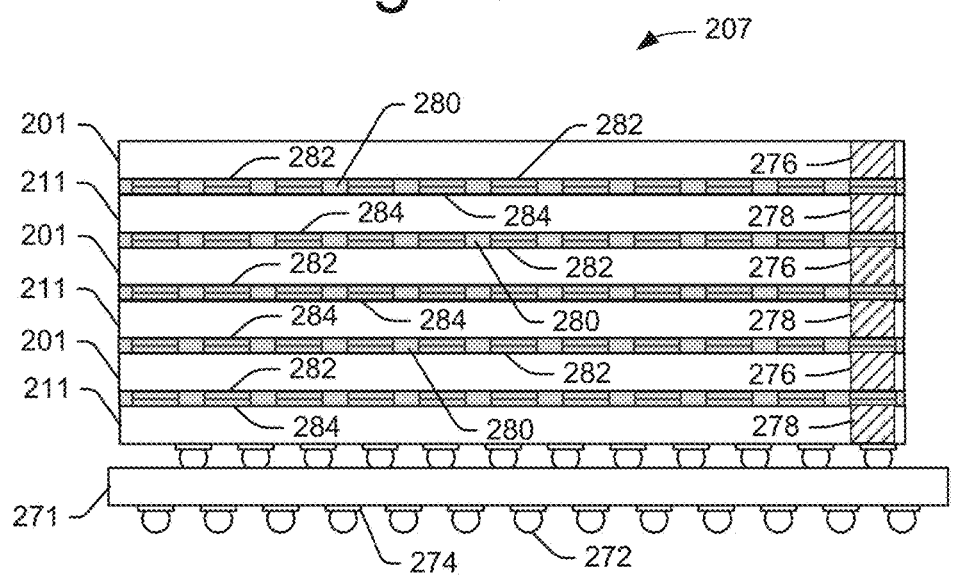

FIG. 2D depicts a side view of another embodiment of an integrated memory assembly 207 stacked on a substrate 271. The integrated memory assembly 206 of FIG. 2D has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 2C, the integrated memory assembly 207 in FIG. 2D does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 3:
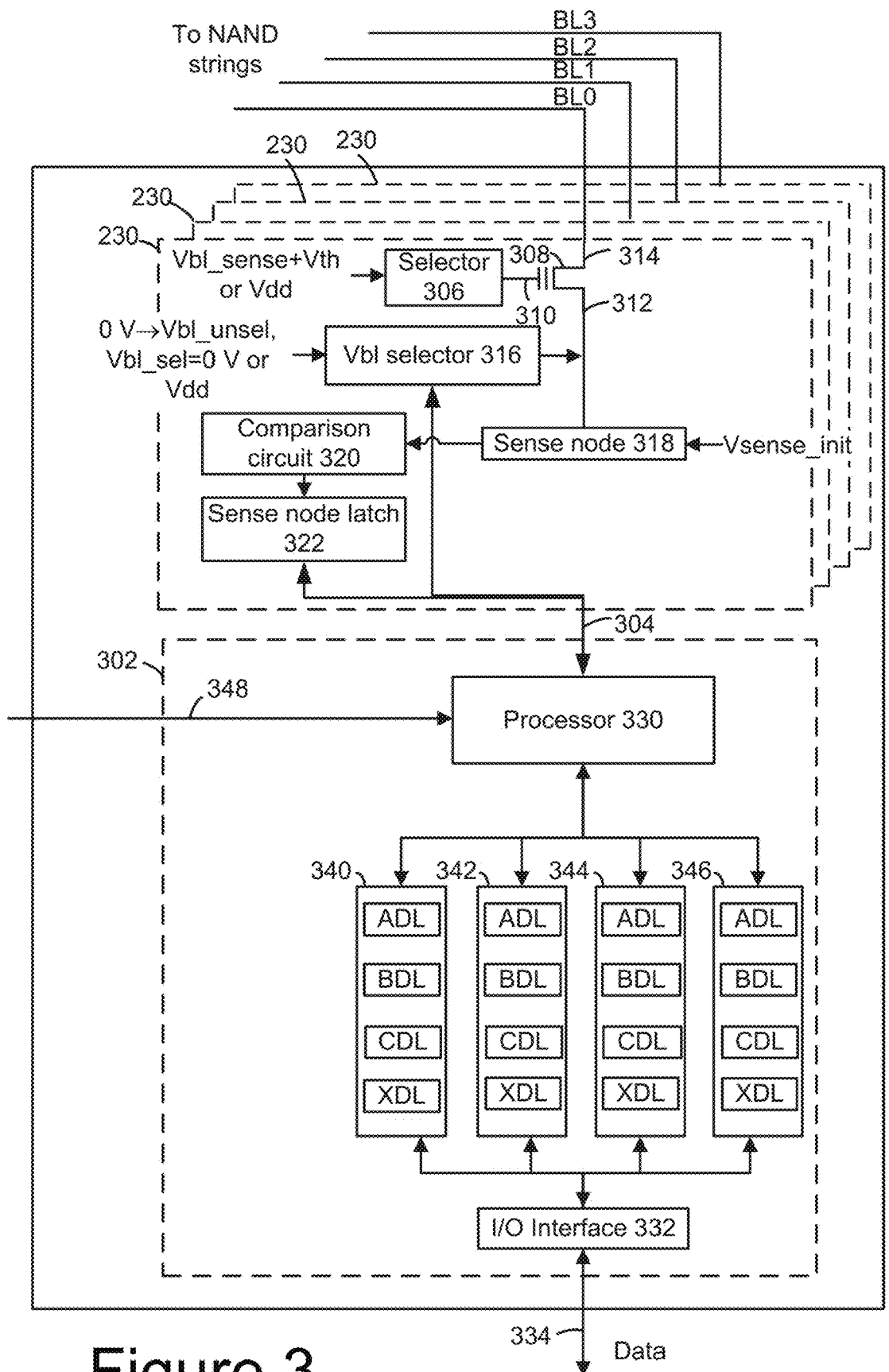
FIG. 3 depicts circuitry used to sense data from non-volatile memory.

FIG. 3 is a block diagram depicting one embodiment of a portion of column control circuitry 210 that is partitioned into a plurality of sense amplifiers 230, and a common portion, referred to as a managing circuit 302. In one embodiment, each sense amplifier 230 is connected to a respective bit line which in turn is connected to one or more NAND strings. In one example implementation, each bit line is connected to six NAND strings, with one NAND string per sub-block. Managing circuit 302 is connected to a set of multiple (e.g., four, eight, etc.) sense amplifiers 230. Each of the sense amplifiers 230 in a group communicates with the associated managing circuit via data bus 304.

Each sense amplifier 230 operates to provide voltages to bit lines (see BL0, BL1. BL2. BL3) during program, verify, erase and read operations. Sense amplifiers are also used to sense the condition (e.g., data state) to a memory cells in a NAND string connected to the bit line that connects to the respective sense amplifier.

Each sense amplifier 230 includes a selector 306 or switch connected to a transistor 308 (e.g., an nMOS). Based on voltages at the control gate 310 and drain 312 of the transistor 308, the transistor can operate as a pass gate or as a bit line clamp. When the voltage at the control gate is sufficiently higher than the voltage on the drain, the transistor operates as a pass gate to pass the voltage at the drain to the bit line (BL) at the source 314 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 306 may pass a power supply voltage Vdd, (e.g., 3-4 V) to the control gate of the transistor 308 to cause it to operate as a pass gate.

When the voltage at the control gate is lower than the voltage on the drain, the transistor 308 operates as a source-follower to set or clamp the bit line voltage at Vcg-Vth, where Vcg is the voltage on the control gate 310 and Vth, e.g., 0.7 V, is the threshold voltage of the transistor 308. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 310 is referred to as a bit line clamp voltage, Vblc. This mode can be used during sensing operations such as read and verify operations. The bit line voltage is thus set by the transistor 308 based on the voltage output by the selector 306. For example, the selector 306 may pass Vsense+Vth, e.g., 1.5 V, to the control gate of the transistor 308 to provide Vsense, e.g., 0.8 V, on the bit line. A Vbl selector 316 may pass a relatively high voltage such as Vdd to the drain 312, which is higher than the control gate voltage on the transistor 308, to provide the source-follower mode during sensing operations. Vbl refers to the bit line voltage.

The Vbl selector 316 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 316 can pass a program-enable voltage signal such as 0 V for respective bit lines of selected NAND strings during a program loop.

In one approach, the selector 306 of each sense circuit can be controlled separately from the selectors of other sense circuits. The Vbl selector 316 of each sense circuit can also be controlled separately from the Vbl selectors of other sense circuits.

During sensing, a sense node 318 is charged up to an initial voltage, Vsense_init, such as 3 V. The sense node is then passed to the bit line via the transistor 308, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 320 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. For example, in a program-verify test, a 0 can denote fail and a 1 can denote pass. The bit in the sense node latch can be read out in a state bit scan operation of a scan operation or flipped from 0 to 1 in a fill operation. The bit in the sense node latch 322 can also be used in a lockout scan to decide whether to set a bit line voltage to an inhibit or program level in a next program loop. L Managing circuit 302 comprises a processor 330, four example sets of data latches 340, 342, 344 and 346, and an I/O interface 332 coupled between the sets of data latches and the data bus 334. FIG. 3 shows four example sets of data latches 340, 342, 344 and 346; however, in other embodiments more or less than four can be implemented. In one embodiment, there is one set of latches for each sense amplifier 230. One set of three data latches, e.g., comprising individual latches ADL, BDL, CDL and XDL, can be provided for each sense circuit. In some cases, a different number of data latches may be used. In a three bit per memory cell embodiment, ADL stores a bit for a lower page of data, BDL stores a bit for a middle page of data, CDL stores a bit for an upper page of data and XDL serves as an interface latch for storing/latching data from the memory controller.

Processor 330 performs computations, such as to determine the data stored in the sensed memory cell and store the determined data in the set of data latches. Each set of data latches 340-346 is used to store data bits determined by processor 330 during a read operation, and to store data bits imported from the data bus 334 during a program operation which represent write data meant to be programmed into the memory. I/O interface 332 provides an interface between data latches 340-346 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to processor 330 via the data bus 304. At that point, processor 330 determines the resultant memory state by consideration of the tripping event(s) of the sense circuit and the information about the applied control gate voltage from the state machine via input lines 348. It then computes a binary encoding for the memory state and stores the resultant data bits into data latches 340-346.

Some implementations can include multiple processors 330. In one embodiment, each processor 330 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 330 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 340-346 from the data bus 334. During reprogramming, a respective set of data latches of a memory cell can store data indicating when to enable the memory cell for reprogramming based on the program pulse magnitude.

The program operation, under the control of the state machine 262, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 330 monitors the read back memory state relative to the desired memory state. When the two are in agreement, processor 330 sets the bit line in a program inhibit mode such as by updating its latches. This inhibits the memory cell coupled to the bit line from further programming even if additional program pulses are applied to its control gate.

Figure 4:
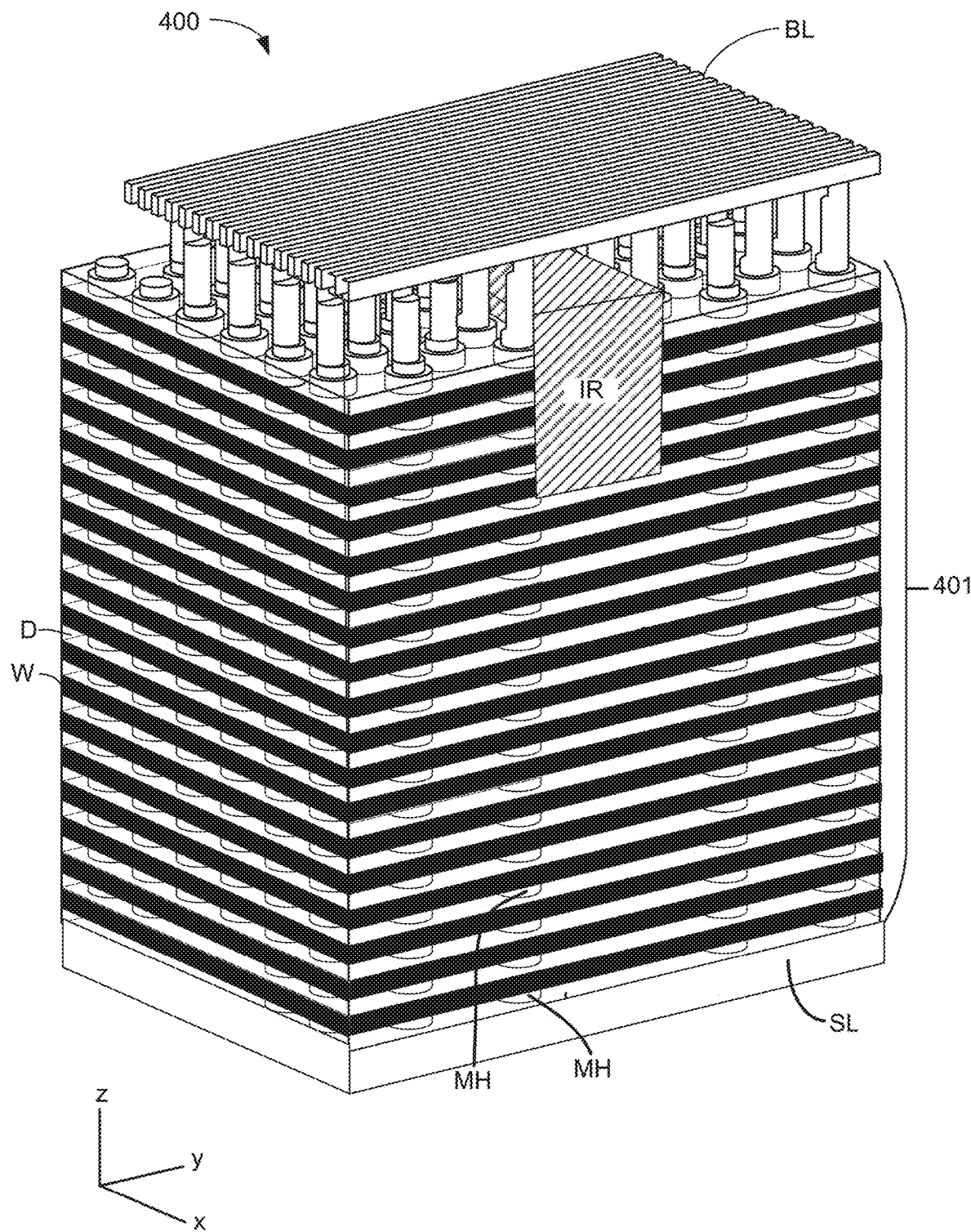
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
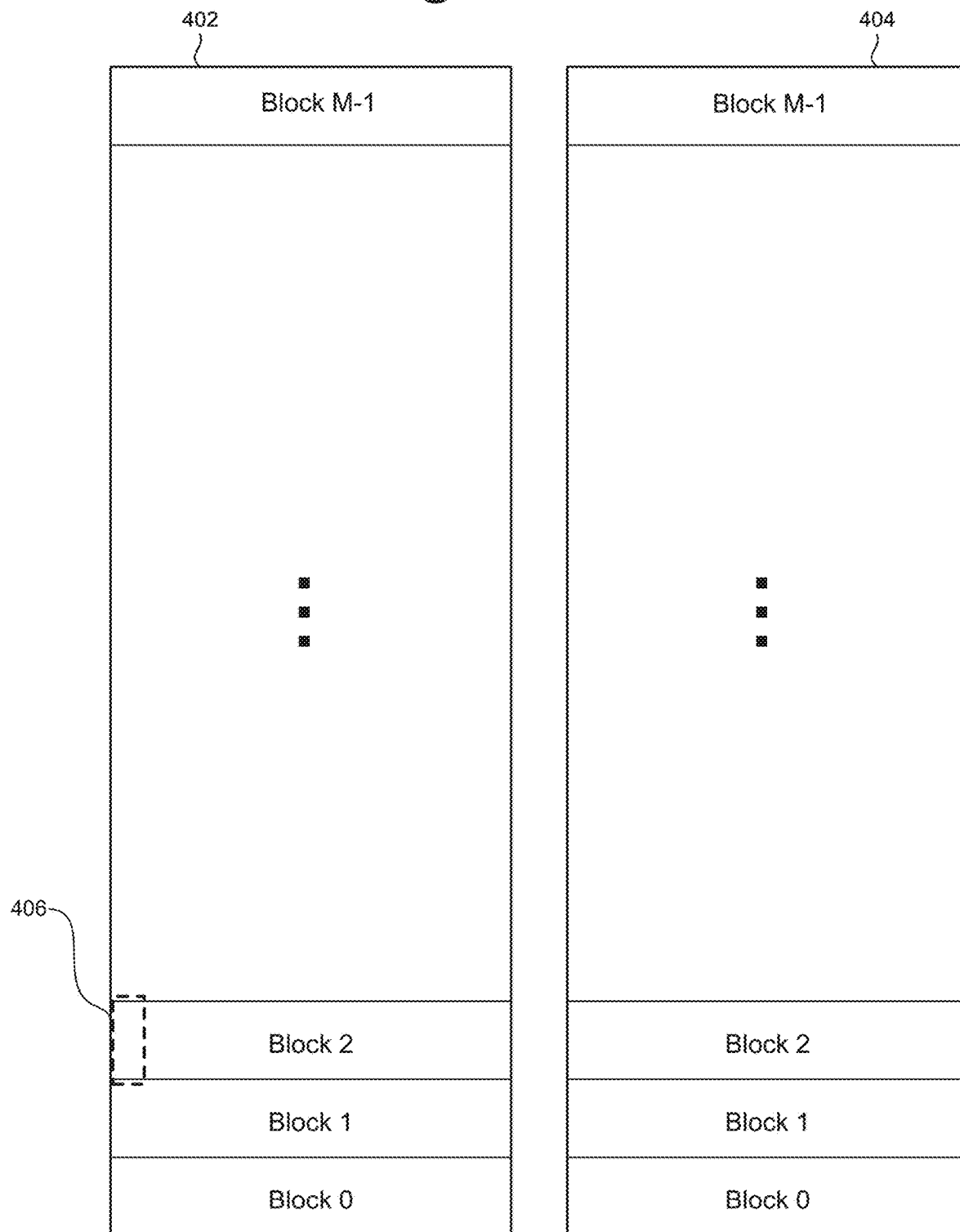
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or less than two planes can be implemented. In some embodiments, memory structure 202 includes eight planes.

Figure 4B:
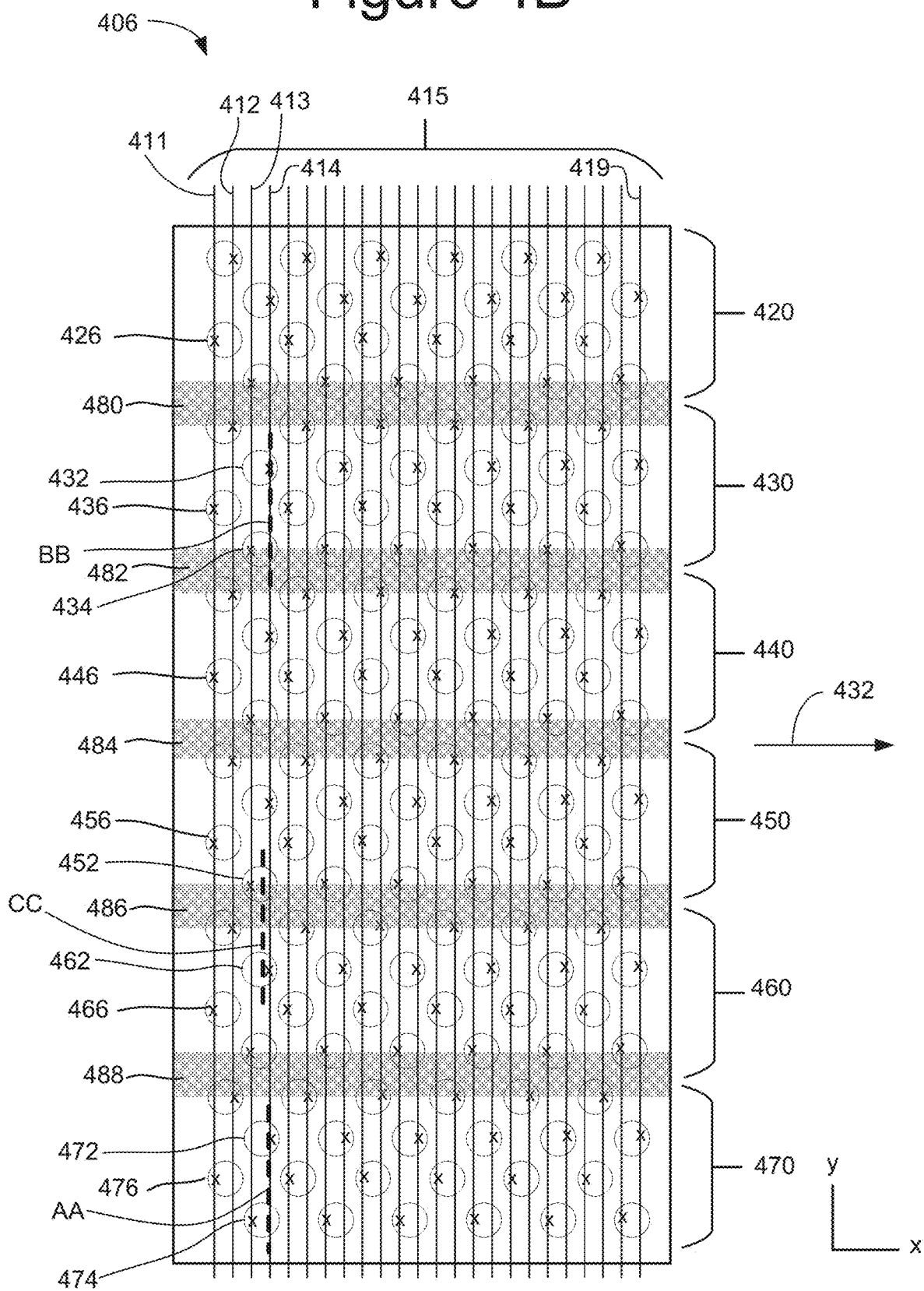
FIG. 4B depicts a top view of a portion of one embodiment of a block of memory cells.

FIGS. 4B-4J depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of $SiO_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line only connects to one vertical column/NAND string in each of regions (sub-blocks) 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4C includes three drain side select layers SGD0, SGD1 and SGD2; three source side select layers SGS0, SGS1, and SGS2; three dummy word line layers DD0, DD1, and DDS; two hundred and forty word line layers WL0-WL239 for connecting to data memory cells, and two hundred and fifty dielectric layers Dl0-DL249. Other embodiments can implement more or less than the numbers described above for FIG. 4C. In one embodiment, SGD0, SGD1 and SGD2 are connected together; and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 442 has a source end at a bottom of the stack and a drain end at a top of the stack. As in agreement with FIG. 4B, FIG. 4C show vertical column 442 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL249. For example, dielectric layers DL240 is above word line layer WL235 and below word line layer WL236. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1 and DS connect to dummy memory cells. A dummy memory cell does not store and is not eligible to store host data (data provided from the host or entity outside of the storage system 100), such as data from a user of the host), while a data memory cell is eligible to store host data. Host data can be contrasted with system data that is generated by memory system 100 (e.g., L2P tables). In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

Note that the stack of word lines WL0-WL239 include two edge word lines at the edges of the stack, including top edge word line WL239 and bottom edge word line WL0. Word lines WL1-WL238 are non-edge word lines.

Figure 4D:
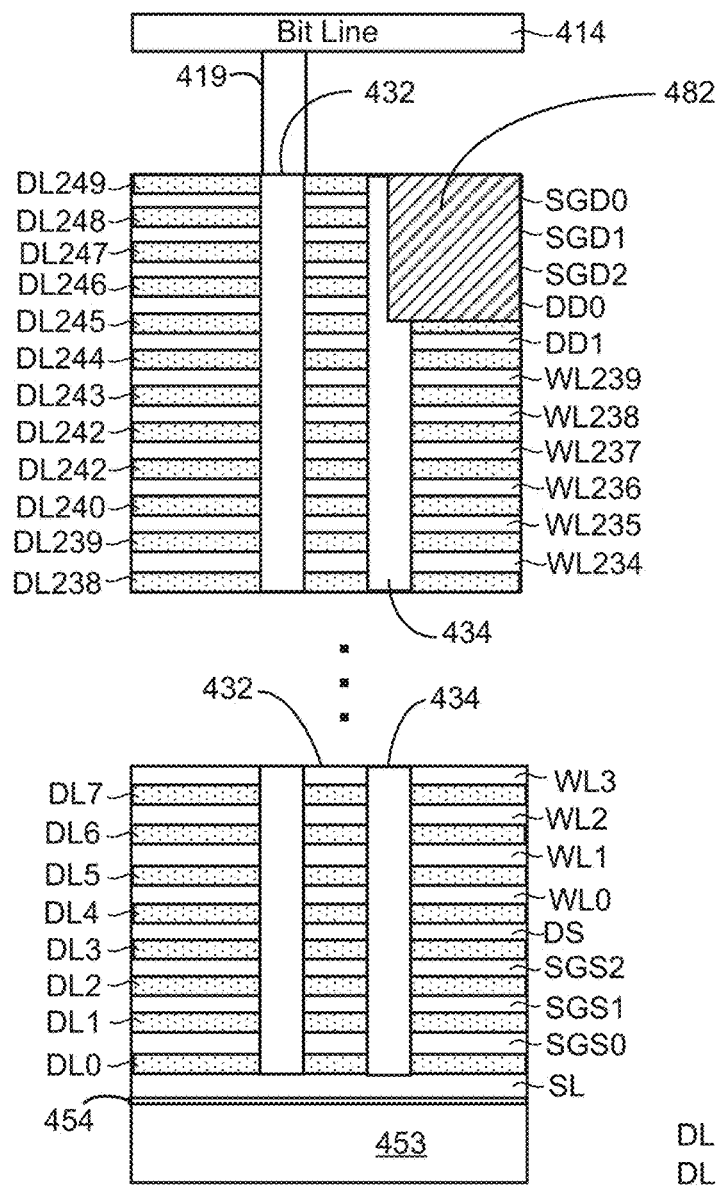
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 480, 482, 484, 486 and 488) occupy space that would have been used for a portion of the memory holes/vertical columns/NAND stings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, SGD2, and DD0 has a semi-circular cross section. In one embodiment, after the stack of alternating conductive and dielectric layers is formed, the stack is etched to create space for the isolation region and that space is then filled in with $SiO_2$.

Figure 4E:
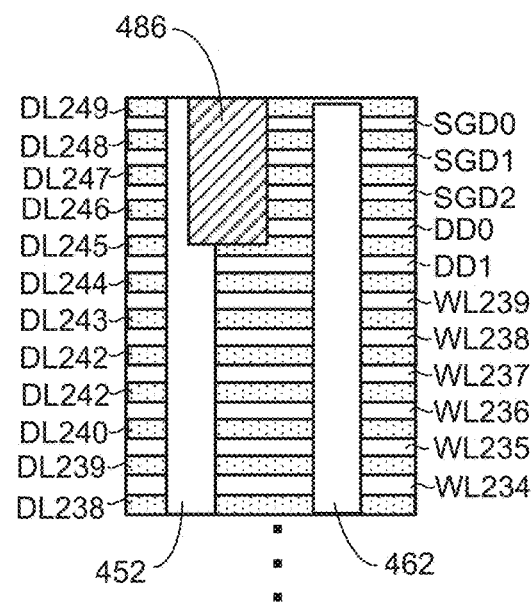
FIG. 4E depicts a cross sectional view of a portion of one embodiment of a block of memory cells.

FIG. 4E depicts a portion of one embodiment of a three dimensional memory structure 202 showing a cross-sectional view along line CC of FIG. 4B. This cross sectional view cuts through vertical columns (NAND strings) 452 and 4624 (see FIG. 4B). FIG. 4E shows the same alternating conductive and dielectric layers as FIG. 4C. FIG. 4E also shows isolation region 486 cutting into vertical columns (NAND string) 452.

Figure 4F:
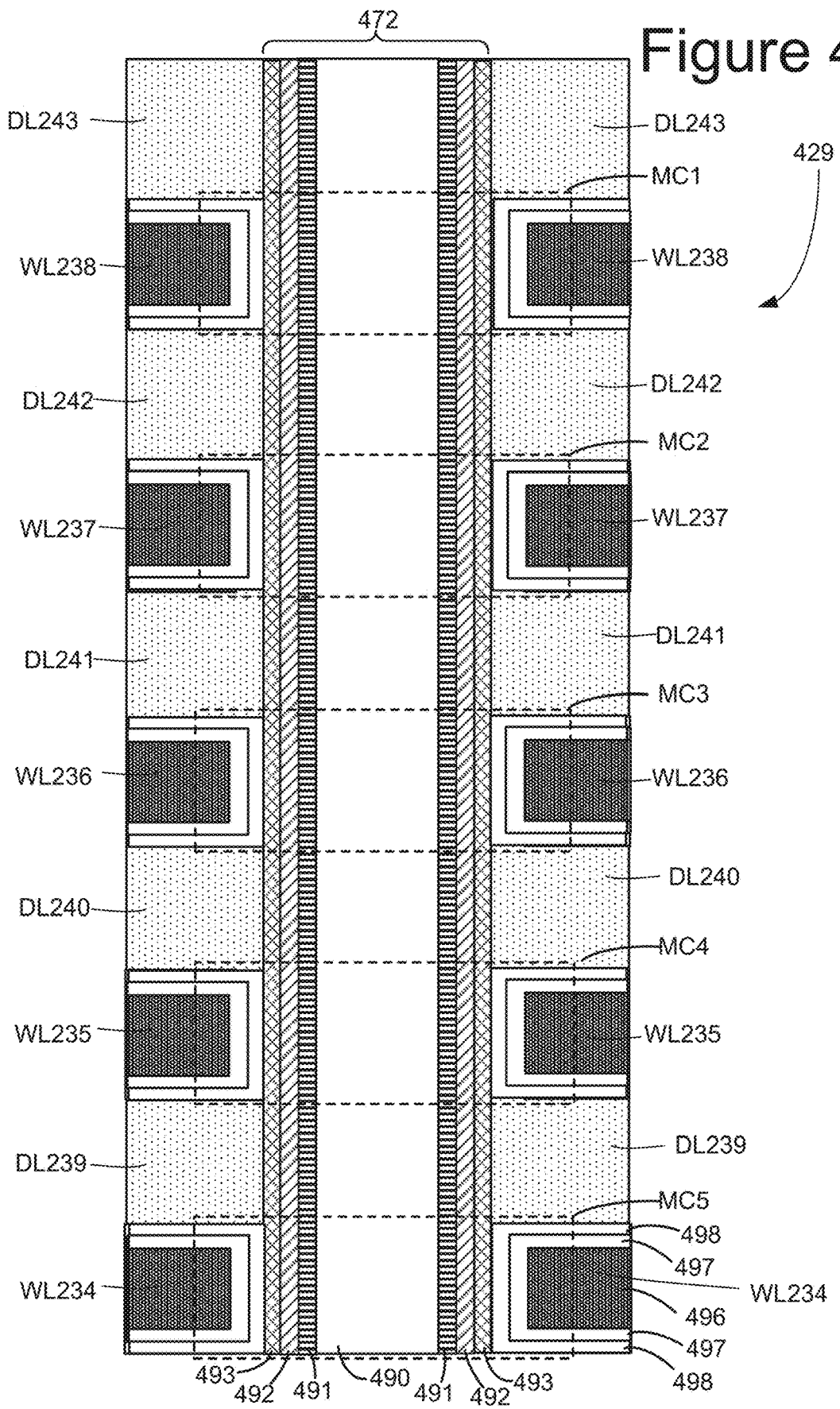
FIG. 4F is a cross sectional view of one embodiment of a vertical column of memory cells.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4D depicts dielectric layers DLL239, DLL240, DLL241, DLL242 and DLL243, as well as word line layers WLL234, WLL235, WLL236, WLL237, and WLL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WLL238 and a portion of vertical column 472 comprise a memory cell MC1. Word line layer WL237 and a portion of vertical column 472 comprise a memory cell MC2. Word line layer WLL236 and a portion of vertical column 472 comprise a memory cell MC3. Word line layer WLL235 and a portion of vertical column 472 comprise a memory cell MC4. Word line layer WLL234 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
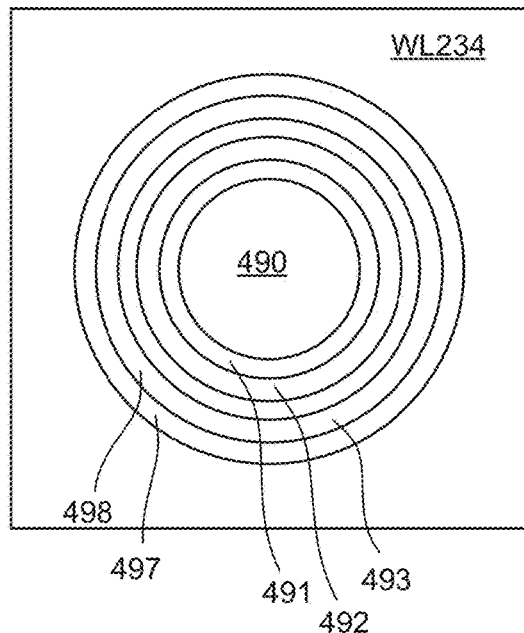
FIG. 4G depicts a cross section of as memory hole that implements a vertical NAND string.

FIG. 4G shows a cross section of vertical column 472 of FIG. 4F, cut through MC5. Thus, FIG. 4G depicts word line layer WL234, inner core 490, channel 491, tunneling dielectric 492, charge trapping layer 493, aluminum oxide layer 497, and blocking oxide layer 498.

Figure 4H:
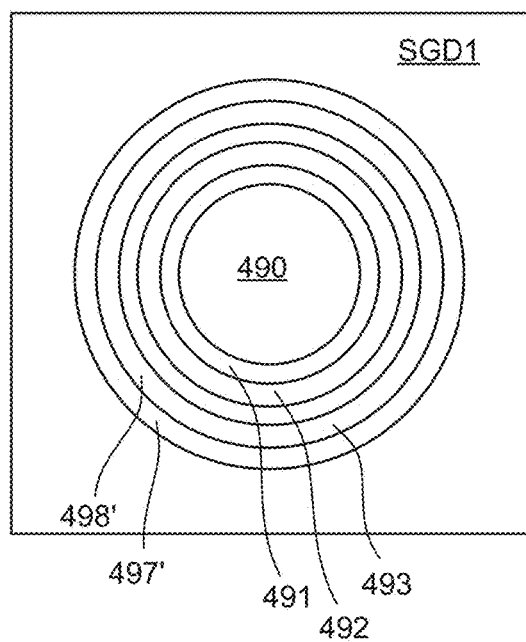
FIG. 4H depicts a cross section of as memory hole that implements a vertical NAND string.

FIG. 4H shows a cross section of vertical column 472 of FIG. 4F, cut through SGD1 (a select gate layer implementing a select gate). Thus, FIG. 4H depicts drain side select line layer SGD1, inner core 490, channel 491, tunneling dielectric 492, charge trapping layer 493, aluminum oxide layer 497, and blocking oxide layer 498.

Figure 4I:
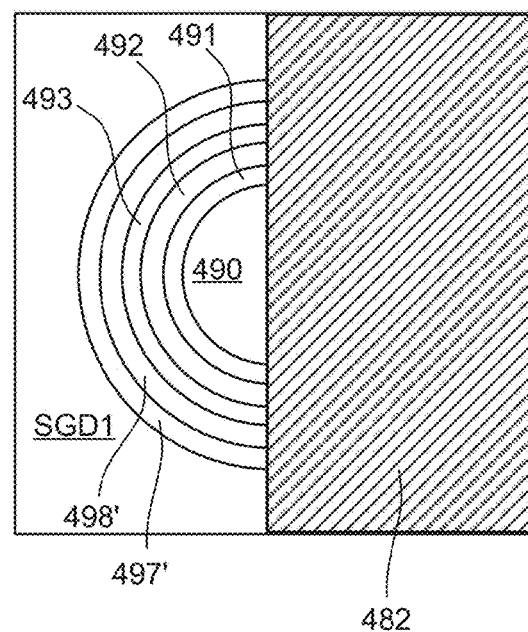
FIG. 4I depicts a cross section of as memory hole that implements a vertical NAND string.

FIG. 4I shows a cross section of vertical column 434 of FIG. 4D, cut through SGD1. Thus, FIG. 4I depicts drain side select line layer SGD1, inner core 490, channel 491, tunneling dielectric 492, charge trapping layer 493, aluminum oxide layer 497, and blocking oxide layer 498. FIG. 4I also shows a portion of isolation region 482. As can be seen in FIG. 4I, the select gate (select gate layer and select line layer) of vertical column 434 is semicircular in shape (or partially circular in shape) due to vertical column (NAND string) 434 intersecting isolation region 482.

Figure 4J:
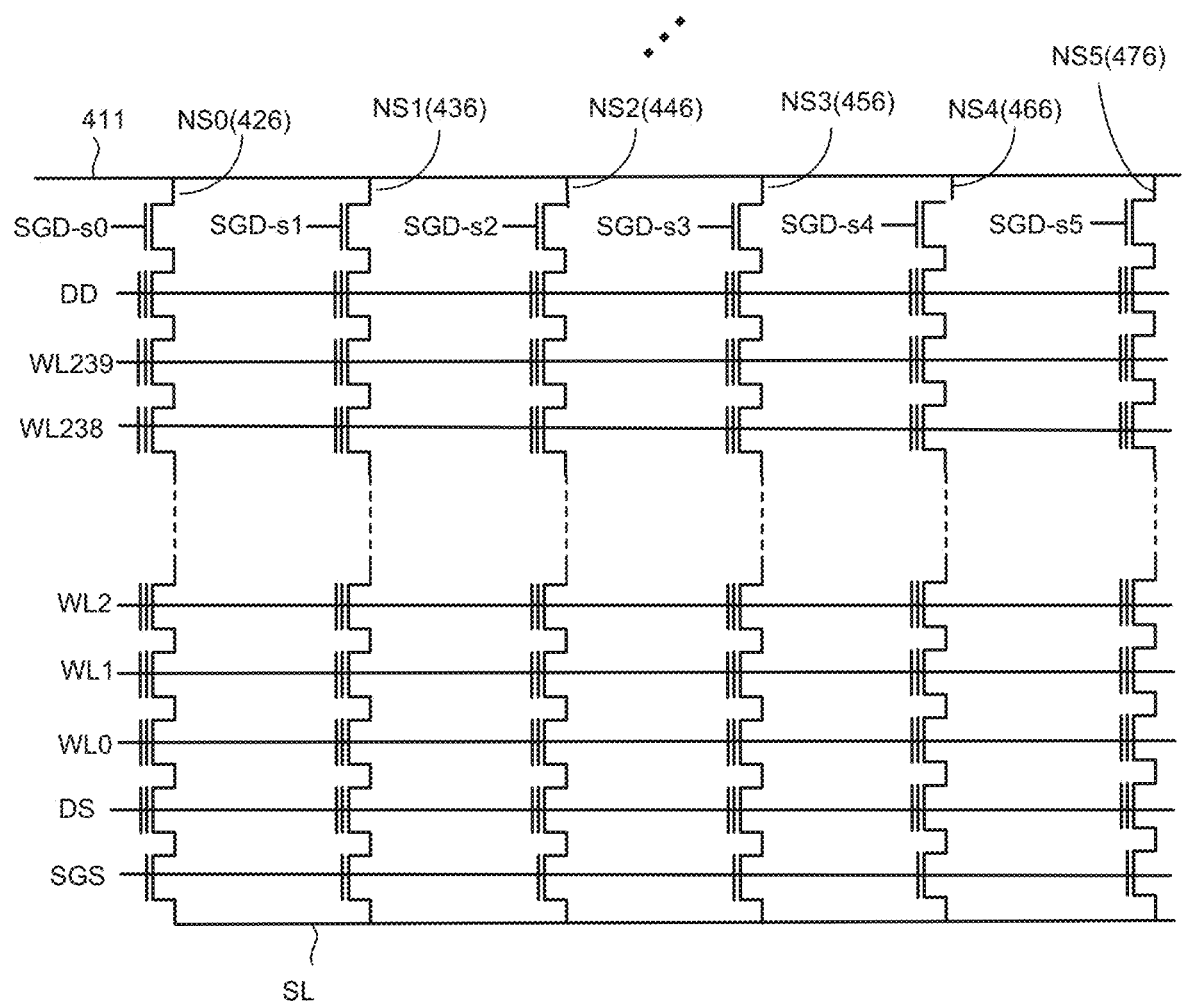
FIG. 4J is a schematic of a plurality of NAND strings in multiple sub-blocks of a same block.

FIG. 4J is a schematic diagram of a portion of the memory array 202 depicted in in FIGS. 4-4I. FIG. 4J shows physical data word lines WL0-WL239 running across the entire block. The structure of FIG. 4J corresponds to a portion 306 in Block 2 of Figure A, including bit line 411. Within the block, in one embodiment, each bit line is connected to six NAND strings. Thus, FIG. 4J shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4E as SGS. Although the select gates SGD-s0, SGD-s1, SGD-s2, SGD-s3, SGD-s4, and SGD-s5 are isolated from each other due to the isolation regions, the data word lines WL0-WL239 of each sub-block are connected together.

The isolation regions (480, 482, 484, 486 and 486) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4J only shows the NAND strings connected to bit line 411. However, a full schematic of the block would show every bit line and six vertical NAND strings connected to each bit line.

Although the example memories of FIGS. 4-4J are three dimensional memory structure that includes vertical NAND strings with charge-trapping material, other (2D and 3D) memory structures can also be used with the technology described herein.

Figure 5A:
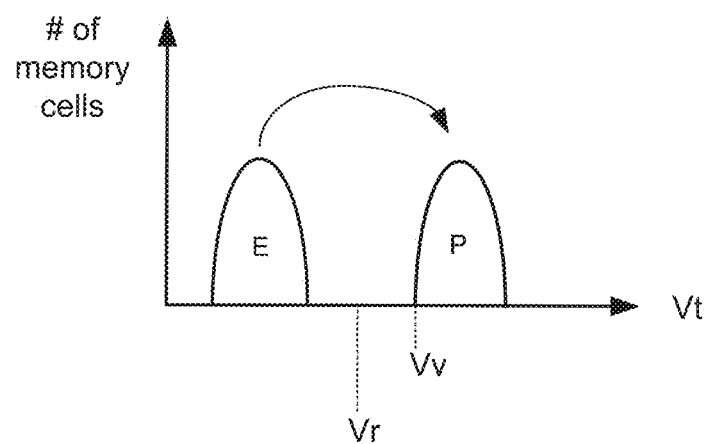
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

FIGS. 5B-F illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

Figure 5B:
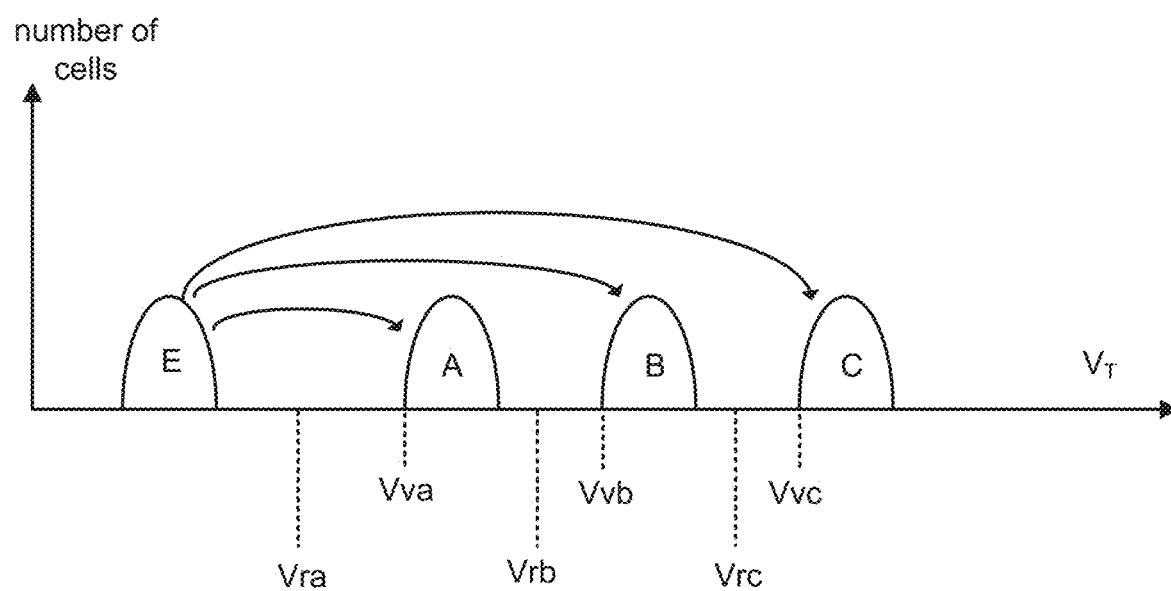
FIG. 5B depicts threshold voltage distributions.

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 5C also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 5C) or verify operation (e.g. see verify target levels VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. Note that in some embodiments, the threshold voltage distributions for a population of memory cells storing four bits of data per memory cell do not overlap and are separated from each other; for example, as depicted in FIG. 5E. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 3262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 1  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

FIG. 5F depicts threshold voltage distributions when each memory cell stores five bits of data, which is another example of MLC data. In one example implementation, when memory cells store five bits of data, the data is stored in any of thirty two data state (e.g., S0-S31).

Figure 6:
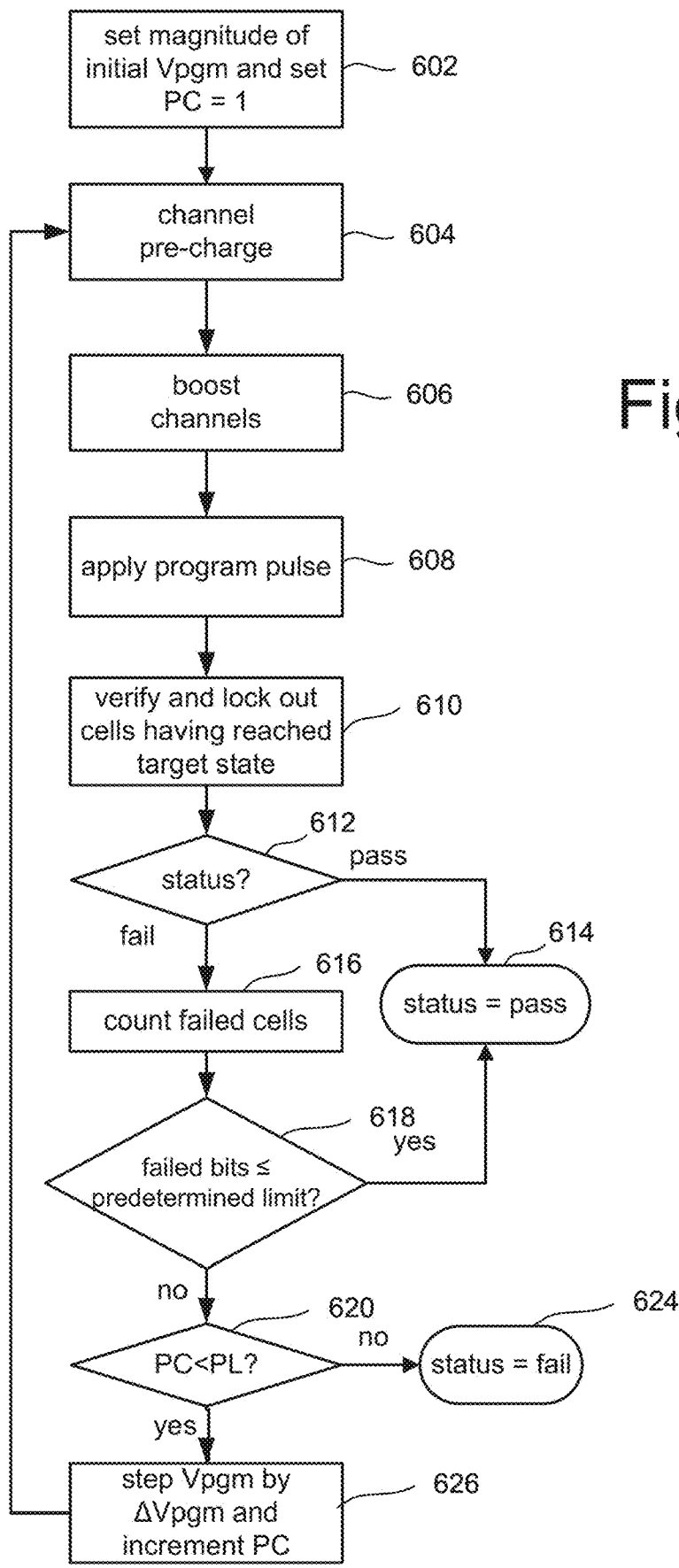
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-pass programming. When implementing multi-pass programming, the process of FIG. 6 is used to implement any/each pass of the multi-pass programming process.

selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts), also referred to as pass voltages, to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 7A:
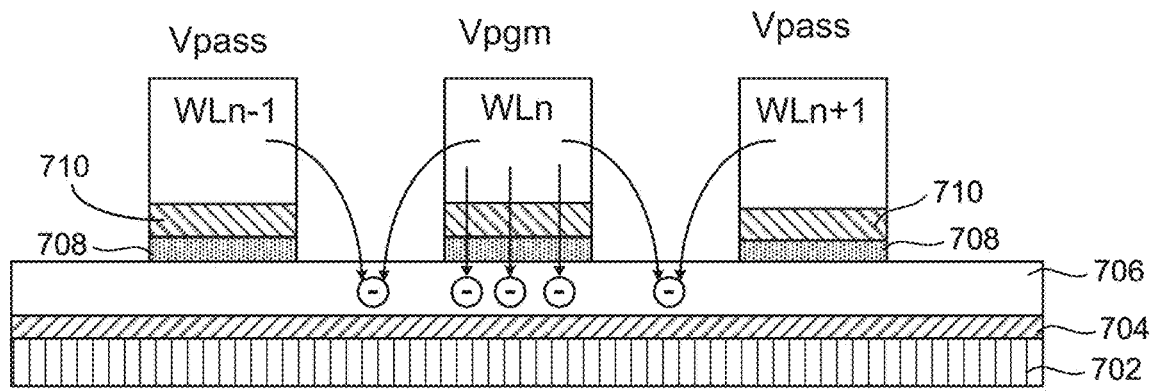
FIGS. 7A and 7B are block diagrams depicting three word lines during programming.
Figure 7B:
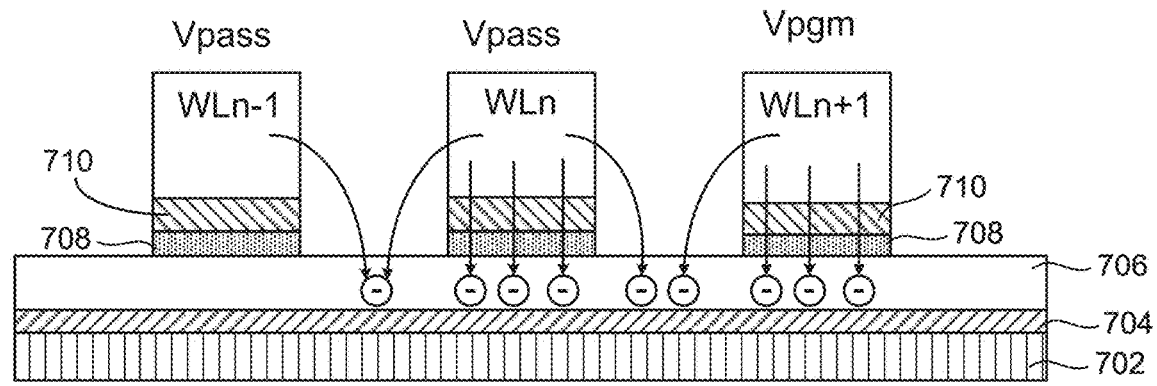

As mentioned above, one issue that poses a challenge for non-volatile memory systems is neighbor word line interference. FIGS. 7A and 7B depict an example of neighbor word line interference. FIGS. 7A and 7B show three word lines: WLn−1, WLn and WLn+1. FIG. 7A describes programming a first word line, denoted as WLn. FIG. 7B describes programming a second word line, denoted as WLn+1, that is adjacent to (e.g., a neighbor of) WLn. For purposes of this document, a first word line is adjacent to a second word line if the second word line is the next word line after the first in the stack of word lines with no other word lines intervening between the first word line and the second word line. In the example of FIG. 7A, word line WLn is adjacent to word line WLn+1 and word line WLn−1. In the example of FIG. 4C, word line WL237 is adjacent to word line WL238 and word line WL236. FIGS. 7A and 7B show five layers of materials below the word lines, including channel layer 702 (corresponding to channel layer 491 of FIG. 4F), tunnel dielectric 704 (corresponding to tunnel dielectric 492 of FIG. 4F), charge trapping layer 706 (corresponding to charge trapping layer 493 of FIG. 4F), blocking oxide 708 (corresponding to blocking oxide 498 of FIG. 4F) and aluminum oxide layer 710 (corresponding to aluminum oxide layer 497 of FIG. 4F).

FIG. 7A shows that when programming word line WLn, Vpgm (e.g., the voltage pulses of step 608) is applied to WLn, while the unselected word lines (WLn-1 and WLn+1) receive pass voltage Vpass (e.g., ~8-10 volts), which causes electrons to move from the selected word line WLn into charge trapping layer 706 (which raises the threshold voltage of the memory cell connected to WLn). A small amount of charge may also move from the unselected word lines WLn−1 and WLn+1 into charge trapping layer 706.

FIG. 7B shows that when programming word line WLn+1, Vpgm (e.g., the voltage pulses of step 608) is applied to WLn+1, while the unselected word lines (WLn and WLn−1) receive Vpass, which causes electrons to move from the selected word line WLn+1 into charge trapping layer 706 (which raises the threshold voltage of the memory cell connected to WLn+1). A small amount of charge may also move from the unselected word lines WLn−1 and WLn into charge trapping layer 706. As can be seen from FIG. 7B, during programming of word line WLn+1 extra charge moves into the space between WLn and WLn+1 in charge trapping layer 706 by the Vpgm and Vpass fringing fields. The extra charge added to charge trapping layer 706 between WLn and WLn+1 can cause an unwanted increase in threshold voltage for the memory cells connected to WLn. This unwanted shift in threshold voltage for memory cells connected to WLn, as a result of programming memory cells connected to WLn+1 is known as neighbor word line interference.

To address the above-described neighbor word line interference, it is proposed to divide the data states into sets of data states. Memory cells are programmed to the set of data states having higher threshold voltage data states before being programmed to sets of data states having lower threshold voltage data states. The memory system also separately programs memory cells connected by an adjacent word line such that memory cells connected by the adjacent word line are programmed to higher data states after memory cells connected by the current word line are programmed to higher data states and prior to memory cells connected by the current word line are programmed to lower data states.

FIG. 8A depicts threshold voltage distributions divided into sets of data states for memory cells that store four bits of data per memory cell. In the example of FIG. 8A, there are three sets of data states. The first set of data states 802 includes data states S11, S12, S13, S14 and S15. The second set of data states 804 includes data states S6, S7, S8, S9 and S10. The third set of data states 806 includes data states S1, S2, S3, S4 and S5. The first set of data states 802 are higher in threshold voltage than the second set of data states 804; for example, data state S11 of the first set of data states 802 has higher threshold voltages than data state S10 of the second set of data states 804. The second set of data states 804 are higher in threshold voltage than the third set of data states 806; for example, data state S6 of the second set of data states 804 has higher threshold voltages than data state S5 of the third set of data states 806.

FIG. 8B depicts another example of threshold voltage distributions divided into sets of data states for memory cells that store four bits of data per memory cell. In the example of FIG. 8B, there are four sets of data states. The first set of data states 822 includes data states S12, S13, S14 and S15. The second set of data states 824 includes data states S8, S9, S10 and S11. The third set of data states 826 includes data states S4, S5, S6 and S7. The fourth set of data states includes data states S1, S2, and S3. The first set of data states 822 are higher in threshold voltage than the second set of data states 824. The second set of data states 824 are higher in threshold voltage than the third set of data states 826. The third set of data states 826 are higher in threshold voltage than the fourth set of data states 828. In other embodiments, more than four sets of data states can be implemented. In other embodiments, the memory system can implement two sets of data states. Memories that include memory cells storing two bits per memory cell, three bits of data per memory cell, five bits per memory cell, etc. can also be configured to divide the threshold voltage distributions into sets of data states. For example, a memory system that stores three bits per memory cell may include a first set of data states E, F, G (see FIG. 5C); a second set of data states C, D; and a third set of data states A, B. Other groupings can also be implemented.

As another example, FIG. 8C depicts threshold voltage distributions divided into sets of data states for memory cells that store five bits of data per memory cell. In the example of FIG. 8C, there are three sets of data states. The first set of data states 842 includes data states S21-S31. The second set of data states 844 includes data states S11-S20. The third set of data states 846 includes data states S1-S10. The first set of data states 842 are higher in threshold voltage than the second set of data states 844. The second set of data states 844 are higher in threshold voltage than the third set of data states 846. Note that the sets of data states are not required to the same number of states in each set.

FIG. 9 is a flow chart that describes one embodiment for programming data into memory cells that implement threshold voltage distributions divided into sets of data states, as discussed above. Memory cells are programmed to the set of data states having higher threshold voltage data states before programming to sets of data states having lower threshold voltage data states. The process of FIG. 9 can be implemented by any of the examples of control circuits discussed above.

In step 900, the control circuit completes programming to the first set of data states prior to starting programming to the second set of data states for non-volatile memory cells connected to a first word line (e.g., WLn). As explained above, the first set of data states are higher in threshold voltage than the second set of data states. In one embodiment, step 900 includes performing the process of FIG. 6 to program data to the set of data states having the highest threshold voltage. Consider the example of FIG. 8A, where memory cells are storing data as four bits per memory. The data is being programmed to memory cells connected to a common word line (the first word line) and the set of data will cause the memory cells to be evenly (or unevenly) distributed among S0-S15. In step 900, those memory cells that are targeted to be programmed to states S11-S15 (e.g., first set of data states 802) are programmed using the process of FIG. 6.

Figure 10A:
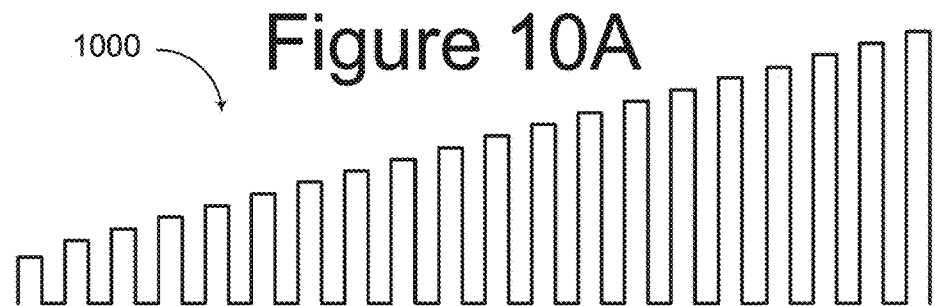
FIGS. 10A-10D depict voltage wave forms for a programming signal comprising voltage pulses.
Figure 10B:
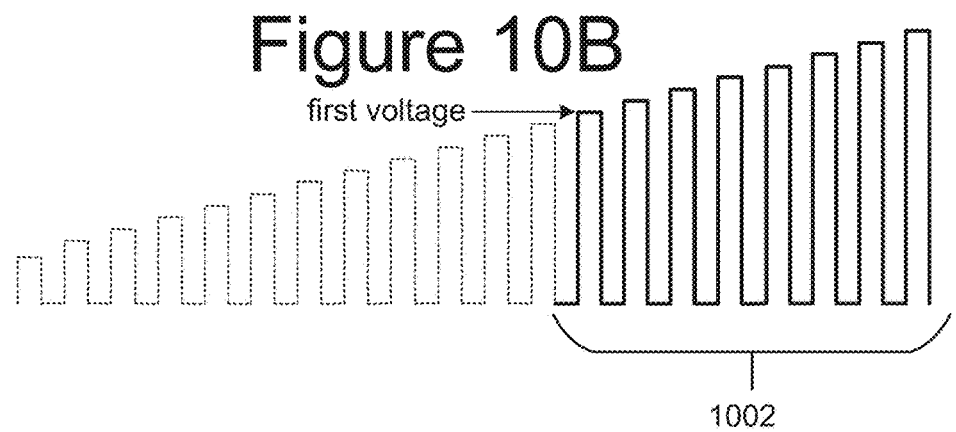

One example implementation of step 900 includes applying first voltage pulses to the first word line to program to the first set of data states the non-volatile memory cells connected to the first word line (step 902). The first voltage pulses have an initial magnitude at a first voltage. For example, step 608 of FIG. 6 includes applying a voltage program pulse. Traditionally, when performing the process of FIG. 6, the loop comprising steps 604-626 is performed multiple times such that the series of voltage pulses applied during each iteration of step 608 comprise a programming signal (e.g., a plurality of voltage pulses) as depicted in FIG. 10A. However, when performing the process of FIG. 6 as part of step 900, the loop comprising steps 604-626 is performed multiple times such that the series of voltage pulses applied during step 608 comprises a first subset of the programming signal depicted in FIG. 10A. This first subset of the programming signal (referred to as first voltage pulses) is depicted in FIG. 10B, which shows the waveform of FIG. 10A in dashed lines and the first voltage pulses 1002 highlighted by being depicted in solid lines. Thus, step 902 includes applying first voltage pulses 1002 to the first word line to program to the first set of data states 802 non-volatile memory cells connected to the first word line.

In one example implementation, step 900 further includes applying a first pass voltage to unselected word lines while applying the first voltage pulses to the first word line to program to the first set of data states the non-volatile memory cells connected to the first word line (step 904). As discussed above, in step 606 NAND strings that include memory cells connected to the selected word line that are to be inhibited from programming have their channels boosted to inhibit programming by, among other things, applying a pass voltage to unselected word lines to cause the boosting in step 606 of FIG. 6. In one embodiment of the process of FIG. 9, different pass voltages are used for programming to different sets of data states. For example, a first pass voltage (e.g., 9 v) is used when programming memory cells to the first set of data states 802, a second pass voltage (e.g., 8 v) is used when programming memory cells to the second set of data states 804, and a third pass voltage (e.g., 7 v) is used when programming memory cells to the third set of data states 806. In one embodiment, the second pass voltage is lower than the first pass voltage and the third pass voltage is lower than the second pass voltage.

Figure 10C:
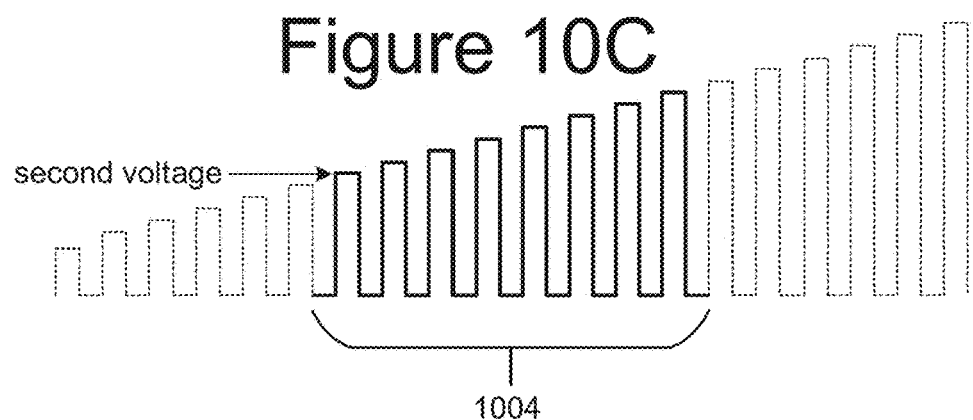

In step 910 of FIG. 9, the control circuit completes programming to the second set of data states (e.g. 804) prior to starting programming to the third set of data states (e.g., 806) for the non-volatile memory cells connected to the first word line. The second set of data states are higher in threshold voltage than the third set of data states. In the example of FIG. 8A discussed above, those memory cells that are targeted to be programmed to states S6-S10 (e.g., second set of data states 804) are programmed using the process of FIG. 6. One example implementation of step 910 includes applying second voltage pulses to the first word line to program to the second set of data states the non-volatile memory cells connected to the first word line (step 912). The second voltage pulses have an initial voltage magnitude at a second voltage. The second voltage is less than the first voltage. When performing the process of FIG. 6 as part of step 910, the loop comprising steps 604-626 is performed multiple times such that the series of voltage pulses applied during each iteration of step 608 comprise a second subset of the programming signal depicted in FIG. 10A. This second subset of the programming signal (referred to as second voltage pulses 1004) is depicted in FIG. 10C, which shows the waveform of FIG. 10A in dashed lines and the second voltage pulses 1004 highlighted by being depicted in solid lines. The magnitude of the first pulse of second voltage pulses 1004 is at the second voltage. Thus, step 912 includes applying second voltage pulses 1004 to the first word line to program to the second set of data states 804 the non-volatile memory cells connected to the first word line. Note that the use of "first" in "first word line" is being used as an identifier and is not meant to imply a location or order; therefore, the first word line can be any of WL0-WL239.

In one example implementation, step 910 further includes applying a second pass voltage to unselected word lines while applying the second voltage pulses to the first word line to program to the second set of data states the non-volatile memory cells connected to the first word line (step 914). As discussed above, in step 606 of FIG. 6 NAND strings that include memory cells connected to the selected word line that are to be inhibited from programming have their channels boosted to inhibit programming by, among other things, applying a pass voltage to unselected word lines to cause the boosting in step 606 of FIG. 6. In one embodiment of the process of FIG. 9, different pass voltages are used for programming to different sets of data states. For example, in step 914, the second pass voltage is used when programming memory cells to the second set of data states 804.

Figure 10D:
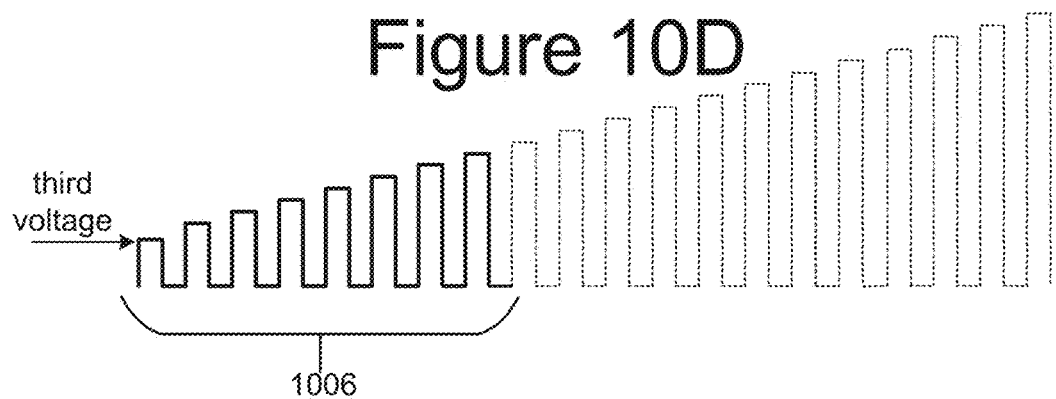

In step 920 of FIG. 9, the control circuit completes programming to the third set of data states (e.g., 806) for the non-volatile memory cells connected to the first word line. In the example of FIG. 8A discussed above, those memory cells that are targeted to be programmed to states S1-S5 (e.g., third set of data states 806) are programmed using the process of FIG. 6. One example implementation of step 920 includes applying third voltage pulses to the first word line to program to the third set of data states 806 the non-volatile memory cells connected to the first word line (step 922). The third voltage pulses have an initial magnitude at a third voltage. The third voltage is less than the second voltage. The exact magnitudes of the first voltage, second voltage and third voltage are implementation dependent. In one embodiment, the third voltage is in the range of 13-14 volts. When performing the process of FIG. 6 as part of step 920, the loop comprising steps 604-626 is performed multiple times such that the series of voltage pulses applied during each iteration of step 608 comprise a third subset of the programming signal depicted in FIG. 10A. This third subset of the programming signal (referred to as third voltage pulses 1006) is depicted in FIG. 10D, which shows the waveform of FIG. 10A in dashed lines and the third voltage pulses 1006 highlighted by being depicted in solid lines. Thus, step 922 includes applying third voltage pulses 1006 to the first word line to program to the third set of data states 806 the non-volatile memory cells connected to the first word line.

In one example implementation, step 910 further includes applying the third pass voltage to unselected word lines while applying the third voltage pulses to the first word line to program to the third set of data states the non-volatile memory cells connected to the first word line (step 924). As discussed above, in step 606 of FIG. 6 NAND strings that include memory cells connected to the selected word line that are to be inhibited from programming have their channels boosted to inhibit programming by, among other things, applying a pass voltage to unselected word lines to cause the boosting in step 606 of FIG. 6. In one embodiment of the process of FIG. 9, different pass voltages are used for programming to different sets of data states. For example, in step 924, the third pass voltage is used when programming memory cells to the third set of data states 804.

The process of FIG. 9 can also be extended with one or more additional steps for additional sets of data states. For example, if the data states are grouped into four sets of data states (see e.g., FIG. 8B), then the control circuit is further configured to start programming to a fourth set of data states for the non-volatile memory cells connected to the first word line after completing programming to the third set of data states for the non-volatile memory cells connected to the first word line such that the third set of data states 826 are higher in threshold voltage than the fourth set of data states 828.

Figure 11:
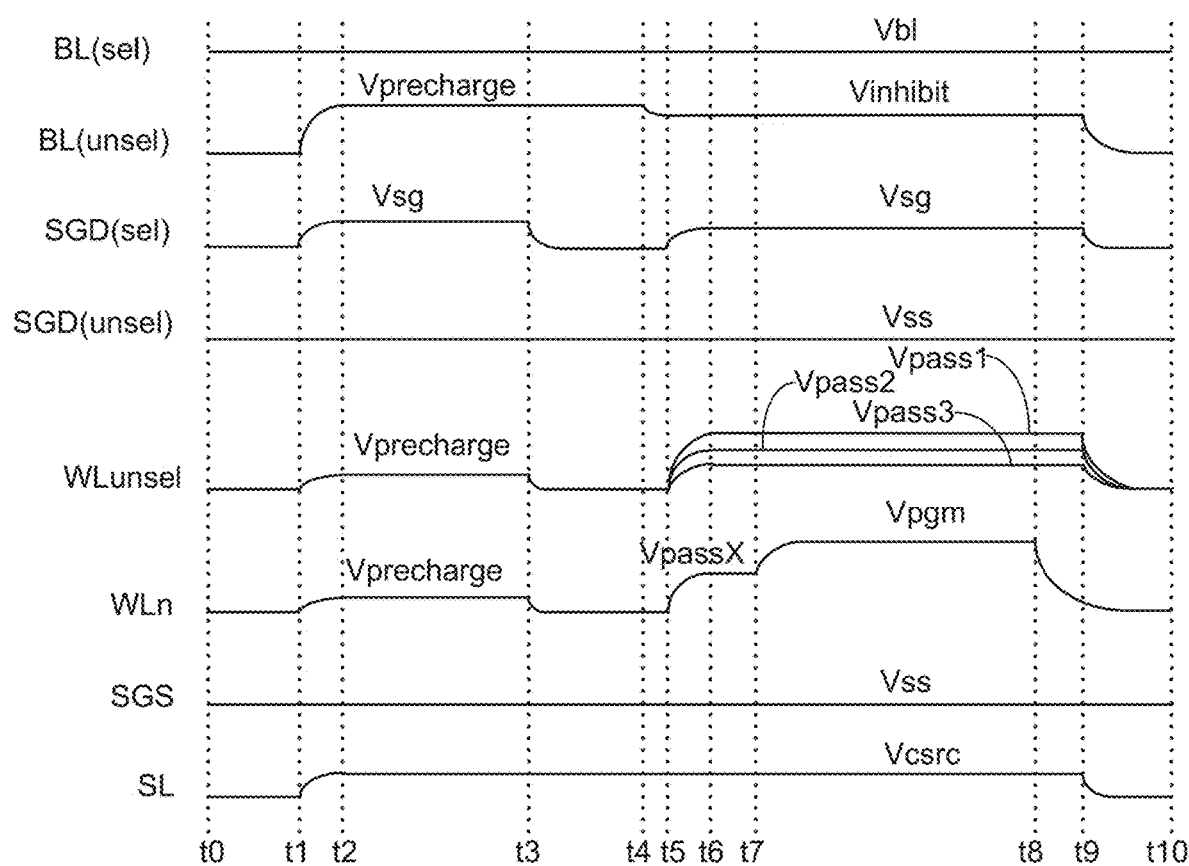
FIG. 11 is a signal diagram depicting the behavior of certain voltage signals during programming.

As discussed above, the process of FIG. 9 includes performing the process of FIG. 6 at least three separate times (e.g., once for step 900, once for step 910 and once for step 920). Each time the process of FIG. 6 is performed, the loop of steps 604-626 is performed multiple times (multiple iterations). FIG. 11 is signal diagram that depicts various control signals used during each iteration of steps 604-626 when performing the process of FIG. 9. Thus, the behavior depicted in FIG. 11 is performed multiple times for step 900, multiple times for step 910 and multiple times for step 920.

FIG. 11 displays the following signals: BL(sel), BL(unsel), SGD(sel), SGD(unsel), WLunsel, WLn, SGS, and SL. The signal BL_(sel) is the bit line signal applied to bit lines connected to NAND strings that are selected for programming. The signal BL(unsel) is the voltage applied to unselected bit lines. The signal SGD(sel) is the SGD selection line for the appropriate portion of the block that is selected for programming. The signal SGD(unsel) is the SGD lines for the portions of the block that are unselected. The signal WLunsel are the unselected word lines, meaning the word lines that are not connected to memory cells selected for being programmed at this time. The signal WLn is the selected word line (e.g., the first word line of FIG. 9). The signal SGS represents all of the source side select lines (see e.g., FIG. 4J). The signal SL is the source line signal (see e.g., FIG. 4J).

In one embodiment, the signal BL (sel) is set at 0 volts. At time t1, BL(unsel) is raised from ground to a pre-charge voltage Vprecharge in order to allow for pre-charging as per step 604 of FIG. 6 At time t4, the unselected bit line voltage BL(unsel) is lowered to Vinhibit (~3-5 volts) and then the voltage is lowered down to ground at time t9. At time t1, SGD (sel) is raised to Vsg which is a voltage high enough to turn on the transistor for the select gate (e.g., 3.5 v). This allows unselected NAND strings to be pre-charged and selected NAND strings to not be pre-charged. The voltage for SGD(sel) is lowered to ground at time t3, raised to Vsg at t5, and lowered to ground at t9. SGS is kept at Vss or ground during the time period of FIG. 20. The source line is raised from ground to Vcsrc (e.g., 2.5-3.5 volts) at time t1 and then lowered to ground at time t9.

The unselected word lines WLunsel are raised to Vprecharge at time t1, lowered to ground at time t3, raised to a pass voltage at time t5, and lowered to ground at time t9. The signal WLunsel is set to Vprecharge in order to allow the pre-charging of step 604 of FIG. 6 and then raised to a pass voltage in order to allow the boosting of step 606 of FIG. 6. FIG. 11 shows three pass voltages Vpass1 (first pass voltage of step 904), Vpass2 (second pass voltage of step 914) and Vpass3 (third pass voltage of step 924), as discussed above with respect to FIG. 9.

The signal WLn is raised to Vprecharge at time t1, lowered to ground at time t3, raised to a pass voltage at time t5, raised to Vpgm (the programming voltage) at time t7, and lowered down to ground at time t8. Note that the voltage on WLn between t7 and t8 represents the voltage pulse used for programming in step 608 (see also steps 902, 912 and 924). The pass voltage (VpassX) that is applied to WLn between t5 and t7 is configured to match the same pass voltage to be used on WLunsel. So if the programming is for the first set of data states then WLn is set to Vpass1 at t5, if the programming is for the second set of data states then WLn is set to Vpass2 at t5. and if the programming is for the third set of data states then WLn is set to Vpass3 at t5.

FIGS. 12A and 12B together are a flow chart that describes one embodiment for programming data into memory cells that implement threshold voltage distributions divided into sets of data states as discussed above. Memory cells are programmed to the set of data states having higher threshold voltage data states before being programmed to sets of data states having lower threshold voltage data states. The memory system also separately programs memory cells connected by an adjacent word line such that memory cells connected by the adjacent word line are programmed to higher data states after memory cells connected by the current word line are programmed to higher data states and prior to memory cells connected by the current word line are programmed to lower data states. The process of FIG. 9 can be implemented by any of the examples of control circuits discussed above. The flow chart of FIGS. 12A and 12B is an example implementation of the process of FIG. 9. FIGS. 13A/B/C-FIGS. 22A/B/C depict the results of various steps of FIGS. 12A and 12B.

FIG. 23 is a table depicting the order of programming to the various sets of data states for the word lines of a same block according to one embodiment of the process of FIGS. 12A and 12B. In the embodiment of FIG. 23, the control circuit is configured to program memory cells in an order starting with memory cells connected to a bottom word line (e.g., WL0) and ending with memory cells connected to a top word line (e.g., WL239). For example: first, memory cells connected to WL0 are programmed to the first set of data states; second, memory cells connected to WL1 are programmed to the first set of data states; third, memory cells connected to WL0 are programmed to the second set of data states; fourth, memory cells connected to WL2 are programmed to the first set of data states; fifth, memory cells connected to WL1 are programmed to the second set of data states; etc. Note that each of the blocks in the flow chart of FIGS. 12A and 12B include a number in parenthesis that corresponds to the step number in the table of FIG. 23. Note that all of the word lines WL0-WL239 are in a same block.

FIG. 24 is a table depicting the order of programming to the various sets of data states for the word lines of a same block according to another embodiment of the process of FIGS. 12A and 12B. In the embodiment of FIG. 24, the control circuit is configured to program memory cells in an order starting with memory cells connected to a top word line (e.g., WL239) and ending with memory cells connected to a bottom word line (e.g., WL0). In one alternative, the control circuit is configured to program memory cells in an order starting with memory cells connected to a word line closest to a drain side of the plurality of non-volatile memory cells (e.g., WL239) and ending with memory cells connected to a word line closest to a source side of the plurality of non-volatile memory cells (e.g., WL0). For example: first, memory cells connected to WL239 are programmed to the first set of data states; second, memory cells connected to WL238 are programmed to the first set of data states; third, memory cells connected to WL239 are programmed to the second set of data states; fourth, memory cells connected to WL237 are programmed to the first set of data states; fifth, memory cells connected to WL238 are programmed to the second set of data states; etc. Note that each of the blocks in the flow chart of FIGS. 12A and 12B include a number in parenthesis that corresponds to the step number in the table of FIG. 24.

Step 1202 of FIG. 12A comprises (1) completing programming to a first set of data states prior to starting programming to a second set of data states for non-volatile memory cells connected to a first word line (e.g., WL0). FIG. 13A shows the condition of the data stored in memory cells connected to WL0 prior to step 1202, for the example of memory cells storing four bits per memory cell in three sets of data states (see FIG. 8A). FIG. 13B shows the condition of the data stored in memory cells connected to WL1 prior to step 1202, for the same example. FIG. 13BC shows the condition of the data stored in memory cells connected to WL2 prior to step 1202, for the same example. Prior to step 1202, all memory cells are in data state S0. In one embodiment, all memory cells in the block are erased (e.g., in data state S0). FIG. 14A depicts the condition of the data stored in memory cells connected to WL0 after step 1202, FIG. 14B depicts the condition of the data stored in memory cells connected to WL1 after step 1202, and FIG. 14C depicts the condition of the data stored in memory cells connected to WL2 after step 1202. As step 1202 includes programming to the first set of data states 802 those memory cells connected to WL0, FIG. 14A shows memory cells connected to WL0 being in any of S0, S11, S12, S13, S14 and S15. No memory cells connected to WL0 have been programmed to S1-S10. FIGS. 14B and 14C show that no memory cells connected to WL1 or WL2 have been programmed to S1-S15. Step 1202 is an example implementation of step 900 using Vpass1 (see FIG. 11) and the first voltage pulses 1002 (FIG. 10B).

Step 1204 comprises, (2) after completing programming to the first set of data states for non-volatile memory cells connected to the first word line and prior to starting programming to the second set of data states for non-volatile memory cells connected to the first word line, completing programming to the first set of data states prior to starting programming to the second set of data states for non-volatile memory cells connected to a second word line. FIG. 15A depicts the condition of the data stored in memory cells connected to WL0 after step 1204, FIG. 15B depicts the condition of the data stored in memory cells connected to WL1 after step 1204, and FIG. 15C depicts the condition of the data stored in memory cells connected to WL2 after step 1204. As step 1204 includes programming to the first set of data states 802 those memory cells connected to WL1, FIG. 15B shows memory cells connected to WL1 being in any of S0, S11, S12, S13, S14 and S15. FIG. 14C shows that no memory cells connected to WL have been programmed to S1-S15. Step 1204 is an example implementation of step 900 using Vpass1 (see FIG. 11) and the first voltage pulses 1002 (FIG. 10B).

Step 1206 comprises, (3) after completing programming to the first set of data states for non-volatile memory cells connected to the second word line and prior to starting programming to the second set of data states for the non-volatile memory cells connected to the second word line, completing programming to the second set of data states for non-volatile memory cells connected to the first word line. FIG. 16A depicts the condition of the data stored in memory cells connected to WL0 after step 1206, FIG. 16B depicts the condition of the data stored in memory cells connected to WL1 after step 1206, and FIG. 16C depicts the condition of the data stored in memory cells connected to WL2 after step 1206. As step 1206 includes programming to the second set of data states 804 those memory cells connected to WL0, FIG. 16A shows memory cells connected to WL0 being in any of S0, and S6-S15; and FIG. 16B shows memory cells connected to WL1 being in any of S0, S11, S12, S13, S14 and S15. No memory cells connected to WL0 have been programmed to S1-S5, no memory cells connected to WL1 have been programmed to S1-S10, and no memory cells connected to WL2 have been programmed to S1-S15. Step 1206 is an example implementation of step 910 using Vpass2 (see FIG. 11) and the second voltage pulses 1004 (FIG. 10BC).

Step 1208 comprises (4) completing programming to the first set of data states for non-volatile memory cells connected to a third word line of the set of word lines after completing programming to the second set of data states for non-volatile memory cells connected to the first word line and before programming to the second set of data states for non-volatile memory cells connected to the second word line. FIG. 17A depicts the condition of the data stored in memory cells connected to WL0 after step 1208, FIG. 17B depicts the condition of the data stored in memory cells connected to WL1 after step 1208, and FIG. 17C depicts the condition of the data stored in memory cells connected to WL2 after step 1208. As step 1208 includes programming to the first set of data states 802 those memory cells connected to WL2, FIG. 17C shows memory cells connected to WL2 being in any of S0, and S11-S15. Step 1208 is an example implementation of step 900 using Vpass1 (see FIG. 11) and the first voltage pulses 1002 (FIG. 10B).

Step 1210 comprises, (5) after completing programming to the second set of data states for non-volatile memory cells connected to the first word line, completing programming to the second set of data states for non-volatile memory cells connected to the second word line. FIG. 18A depicts the condition of the data stored in memory cells connected to WL0 after step 1210, FIG. 18B depicts the condition of the data stored in memory cells connected to WL1 after step 1210, and FIG. 18C depicts the condition of the data stored in memory cells connected to WL2 after step 1210. As step 1210 includes programming to the second set of data states 804 those memory cells connected to WL1, FIG. 18B shows memory cells connected to WL1 being in any of S0, and S6-S15. Step 1210 is an example implementation of step 910 using Vpass2 (see FIG. 11) and the second voltage pulses 1004 (Figure C.

Step 1212 comprises, (6) after completing programming to the second set of data states for non-volatile memory cells connected to the second word line, completing programming to a third set of data states for non-volatile memory cells connected to the first word line. FIG. 19A depicts the condition of the data stored in memory cells connected to WL0 after step 1212, FIG. 19B depicts the condition of the data stored in memory cells connected to WL1 after step 1212, and FIG. 19C depicts the condition of the data stored in memory cells connected to WL2 after step 1212. As step 1212 includes programming to the third set of data states 806 those memory cells connected to WL0, FIG. 19A shows memory cells connected to WL0 being in any of S0-S15. Step 1210 is an example implementation of step 920 using Vpass3 (see FIG. 11) and the third voltage pulses 1006 (FIG. 10D).

Step 1214 comprises (7) completing programming to the first set of data states for non-volatile memory cells connected to a fourth word line of the set of word lines after completing programming to the third set of data states for non-volatile memory cells connected to the first word line.

Step 1250 of FIG. 12B comprises, (8) after completing programming to the first set of data states for non-volatile memory cells connected to the fourth word line, completing programming to the second set of data states for non-volatile memory cells connected to the third word line. FIG. 20A depicts the condition of the data stored in memory cells connected to WL0 after step 1250, FIG. 20B depicts the condition of the data stored in memory cells connected to WL1 after step 1250, and FIG. 20C depicts the condition of the data stored in memory cells connected to WL2 after step 1250. As step 1250 includes programming to the second set of data states 804 those memory cells connected to WL2, FIG. 20C shows memory cells connected to WL2 being in any of S0 and S6-S15. Step 1250 is an example implementation of step 910 using Vpass2 (see FIG. 11) and the second voltage pulses 1004 (FIG. 10D).

Step 1252 comprises, (9) completing programming to the third set of data states for non-volatile memory cells connected to the second word line after completing programming to the second set of data states for non-volatile memory cells connected to the third word line. FIG. 21A depicts the condition of the data stored in memory cells connected to WL0 after step 1252, FIG. 21B depicts the condition of the data stored in memory cells connected to WL1 after step 1252, and FIG. 21C depicts the condition of the data stored in memory cells connected to WL2 after step 1252. As step 1252 includes programming to the third set of data states 806 those memory cells connected to WL1, FIG. 21B shows memory cells connected to WL1 being in any of S0-S15. Step 1252 is an example implementation of step 920 using Vpass3 (see FIG. 11) and the third voltage pulses 1006 (FIG. 10D).

Step 1254 comprises (10) completing programming to the first set of data states for non-volatile memory cells connected to a fifth word line of the set of word lines after completing programming to the third set of data states for non-volatile memory cells connected to the second word line. Step 1256 comprises (11) completing programming to the second set of data states for non-volatile memory cells connected to the fourth word line after completing programming to the first set of data states for non-volatile memory cells connected to the fifth word line.

Step 1258 comprises (12) completing programming to the third set of data states for non-volatile memory cells connected to the third word line after completing programming to the second set of data states for non-volatile memory cells connected to the fourth word line. FIG. 22A depicts the condition of the data stored in memory cells connected to WL0 after step 1258, FIG. 22B depicts the condition of the data stored in memory cells connected to WL1 after step 1258, and FIG. 22C depicts the condition of the data stored in memory cells connected to WL2 after step 1258. As step 1258 includes programming to the third set of data states 806 those memory cells connected to WL2, FIG. 22C shows memory cells connected to WL2 being in any of S0-S15. Step 1258 is an example implementation of step 920 using Vpass3 (see FIG. 11) and the third voltage pulses 1006 (FIG. 10D).

Step 1260 comprises (13) completing programming to the first set of data states for non-volatile memory cells connected to a sixth word line of the set of word lines after completing programming to the third set of data states for non-volatile memory cells connected to the third word line. Step 1262 comprises (14) completing programming to the second set of data states for non-volatile memory cells connected to the fifth word line after completing programming to the first set of data states for non-volatile memory cells connected to the sixth word line. Step 1264 comprises (15) completing programming to the third set of data states for non-volatile memory cells connected to the fourth word line after completing programming to the second set of data states for non-volatile memory cells connected to the fifth word line. The process of FIGS. 12A and 12B will continue to program additional non-volatile memory cells according to the order described by the tables of FIGS. 23 and 24.

A memory system has been described that separately programs memory cells connected by a common word line (e.g., WLn) to multiple sets of data states with the set of data states having higher threshold voltage data states being programmed before the set of data states having lower threshold voltage data states. The memory system also separately programs memory cells connected by an adjacent word line (e.g., WLn+1) to the multiple sets of data states such that memory cells connected by the adjacent word line are programmed to higher data states after memory cells connected by the common word line are programmed to higher data states and prior to memory cells connected by the common word line are programmed to lower data states.

One embodiment includes and apparatus, comprising a control circuit configured to connect to a plurality of non-volatile memory cells via a set of bit lines and a set of word lines. The control circuit is configured to: complete programming to a first set of data states prior to starting programming to a second set of data states for non-volatile memory cells connected to a first word line of the set of word lines, the first set of data states are higher in threshold voltage than the second set of data states; complete programming to the second set of data states prior to starting programming to a third set of data states for the non-volatile memory cells connected to the first word line, the second set of data states are higher in threshold voltage than the third set of data states; and perform programming to the third set of data states for the non-volatile memory cells connected to the first word line.

One embodiment includes a method, comprising: completing programming to a first set of data states prior to starting programming to a second set of data states for non-volatile memory cells connected to a first word line, the first set of data states are higher in threshold voltage than the second set of data states; after completing programming to the first set of data states for non-volatile memory cells connected to the first word line and prior to starting programming to the second set of data states for non-volatile memory cells connected to the first word line, completing programming to the first set of data states prior to starting programming to the second set of data states for non-volatile memory cells connected to a second word line; after completing programming to the first set of data states for non-volatile memory cells connected to the second word line and prior to starting programming to the second set of data states for the non-volatile memory cells connected to the second word line, performing programming to the second set of data states for non-volatile memory cells connected to the first word line; and after completing programming to the second set of data states for non-volatile memory cells connected to the first word line, performing programming to the second set of data states for non-volatile memory cells connected to the second word line.

One embodiment includes an apparatus, comprising a non-volatile memory structure comprising a first plurality of non-volatile memory cells connected to a first word line; and a control circuit connected to the non-volatile memory structure. The control circuit is configured to apply first voltage pulses to the first word line to program the first plurality of non-volatile memory cells to a first set of data states prior to starting programming of the plurality of non-volatile memory cells to a second set of data states, the first set of data states are higher in threshold voltage than the second set of data states, the first voltage pulses have an initial magnitude at a first voltage; apply second voltage pulses to the first word line to program the first plurality of non-volatile memory cells to the second set of data states prior to starting programming of the plurality of non-volatile memory cells to a third set of data states, the second set of data states are higher in threshold voltage than the third set of data states, the second voltage pulses have an initial magnitude at a second voltage, the second voltage is less than the first voltage; and apply third voltage pulses to the first word line to program the first plurality of non-volatile memory cells to the third set of data states, the third voltage pulses have an initial magnitude at a third voltage, the third voltage is less than the second voltage.

One embodiment includes an apparatus, comprising: a non-volatile memory structure comprising a first plurality of memory cells connected to a first word line and a second plurality of memory cells connected to a second word line. the second word line is next to the first word line; and a control circuit connected to the non-volatile memory structure. The control circuit is configured to: separately program the first plurality of memory cells to multiple sets of data states with a set of data states having higher threshold voltage data states completing programming before sets of data states having lower threshold voltage data states; and separately program the second plurality of memory cells to the multiple sets of data states such that memory cells connected to the second word line are programmed to higher data states after memory cells connected to the first word line are programmed to higher data states and prior to the memory cells connected by the common word line are programmed to lower data states.

Various embodiments include separately programming three or more sets of states with the highest Vt states programmed first; completing programming of the highest Vt states before starting programming of the lower states; programming neighbor word lines after the high states and before the lower states; and using different initial programming voltages for high, medium and low states.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a control circuit configured to connect to a plurality of non-volatile memory cells via a set of bit lines and a set of word lines, the control circuit is configured to:
complete programming to a first set of data states prior to starting programming to a second set of data states for non-volatile memory cells connected to a first word line of the set of word lines, the first set of data states are higher in threshold voltage than the second set of data states;
complete programming to the second set of data states prior to starting programming to a third set of data states for the non-volatile memory cells connected to the first word line, the second set of data states are higher in threshold voltage than the third set of data states; and
perform programming to the third set of data states for the non-volatile memory cells connected to the first word line.

2. The apparatus of claim 1, wherein:
the control circuit is configured to apply first voltage pulses to the first word line to program to the first set of data states the non-volatile memory cells connected to the first word line, the first voltage pulses have an initial magnitude at a first voltage;
the control circuit is configured to apply second voltage pulses to the first word line to program to the second set of data states the non-volatile memory cells connected to the first word line, the second voltage pulses have an initial magnitude at a second voltage, the second voltage is less than the first voltage; and
the control circuit is configured to apply third voltage pulses to the first word line to program to the third set of data states the non-volatile memory cells connected to the first word line, the third voltage pulses have an initial magnitude at a third voltage, the third voltage is less than the second voltage.

3. The apparatus of claim 2, wherein:
the control circuit is configured to apply a first pass voltage to an unselected word line while applying the first voltage pulses to the first word line to program to the first set of data states the non-volatile memory cells connected to the first word line;
the control circuit is configured to apply a second pass voltage to the unselected word line while applying the second voltage pulses to the first word line to program to the second set of data states the non-volatile memory cells connected to the first word line, the second pass voltage is lower than the first pass voltage; and
the control circuit is configured to apply a third pass voltage to the unselected word line while applying the third voltage pulses to the first word line to program to the third set of data states the non-volatile memory cells connected to the first word line, the third pass voltage is lower than the second pass voltage.

4. The apparatus of claim 1, wherein:
the control circuit is configured to complete programming to the first set of data states prior to starting programming to the second set of data states for non-volatile memory cells connected to a second word line of the set of word lines after completing programming to the first set of data states for non-volatile memory cells connected to the first word line and prior to starting programming to the second set of data states for non-volatile memory cells connected to the first word line;
the control circuit is configured to perform programming to the second set of data states for non-volatile memory cells connected to the second word line after completing programming to the second set of data states for non-volatile memory cells connected to the first word line and prior to starting programming to the third set of data states for non-volatile memory cells connected to the first word line; and
the control circuit is configured to perform programming to the third set of data states for non-volatile memory cells connected to the second word line after completing programming to the third set of data states for non-volatile memory cells connected to the first word line.

5. The apparatus of claim 4, wherein:
the first word line is adjacent the second word line.

6. The apparatus of claim 4, wherein:
the first word line and the second word line are positioned in a same block.

7. The apparatus of claim 1, wherein:
the control circuit is configured to complete programming to the first set of data states for non-volatile memory cells connected to a second word line of the set of word lines after completing programming to the first set of data states for non-volatile memory cells connected to the first word line and prior to starting programming to the second set of data states for non-volatile memory cells connected to the first word line;
the control circuit is configured to perform programming to the second set of data states for non-volatile memory cells connected to the second word line after completing programming to circuit is configured to complete programming to the first set of data states for non-volatile memory cells connected to a third word line of the set of word lines after completing programming to the second set of data states for non-volatile memory cells connected to the first word line;
the control the first set of data states for non-volatile memory cells connected to the third word line;
the control circuit is configured to perform programming to the second set of data states for non-volatile memory cells connected to the third word line after completing programming to the third set of data states for non-volatile memory cells connected to the first word line;
the control circuit is configured to perform programming to the third set of data states for non-volatile memory cells connected to the second word line after completing programming to the second set of data states for non-volatile memory cells connected to the third word line; and
the control circuit is configured to perform programming to the third set of data states for non-volatile memory cells connected to the third word line after completing programming to the third set of data states for non-volatile memory cells connected to the second word line.

8. The apparatus of claim 7, wherein:
the second word line is adjacent the first word line and the third word line.

9. The apparatus of claim 7, wherein:
the first word line, the second word line and the third word line are positioned in a same block.

10. The apparatus of claim 1, wherein:
the control circuit is configured to complete programming to the first set of data states for non-volatile memory cells connected to a second word line of the set of word lines after completing programming to the first set of data states for non-volatile memory cells connected to the first word line and prior to starting programming to the second set of data states for non-volatile memory cells connected to the first word line;
the control circuit is configured to complete programming to the first set of data states for non-volatile memory cells connected to a third word line of the set of word lines after completing programming to the second set of data states for non-volatile memory cells connected to the first word line;
the control circuit is configured to perform programming to the second set of data states for non-volatile memory cells connected to the second word line after completing programming to the first set of data states for non-volatile memory cells connected to the third word line;
the control circuit is configured to complete programming to the first set of data states for non-volatile memory cells connected to a fourth word line of the set of word lines after completing programming to the third set of data states for non-volatile memory cells connected to the first word line;
the control circuit is configured to perform programming to the second set of data states for non-volatile memory cells connected to the third word line after completing programming to the first set of data states for non-volatile memory cells connected to the fourth word line;
the control circuit is configured to perform programming to the third set of data states for non-volatile memory cells connected to the second word line after completing programming to the second set of data states for non-volatile memory cells connected to the third word line;
the control circuit is configured to perform programming to the first set of data states for non-volatile memory cells connected to a fifth word line of the set of word lines after completing programming to the third set of data states for non-volatile memory cells connected to the second word line;
the control circuit is configured to complete programming to the second set of data states for non-volatile memory cells connected to the fourth word line after completing programming to the first set of data states for non-volatile memory cells connected to the fifth word line; and
the control circuit is configured to perform programming to the third set of data states for non-volatile memory cells connected to the third word line after completing programming to the second set of data states for non-volatile memory cells connected to the fourth word line.

11. The apparatus of claim 10, wherein:
the first word line, the second word line, the third word line, the fourth word line and the fifth word line are arranged in a stack with the fourth word line above the fifth word line, the third word line above the fourth word line, the second word line above the third word line, the first word line above the second word line, the first word line is closest to a drain side of the plurality of non-volatile memory cells as compared to the second word line and the fifth word line is closest to a source side of the plurality of non-volatile memory cells as compared to the fourth word line.

12. The apparatus of claim 1, wherein:
the control circuit is configured to program memory cells in an order starting with memory cells connected to a word line closest to a drain side of the plurality of non-volatile memory cells and ending with memory cells connected to a word line closest to a source side of the plurality of non-volatile memory cells.

13. The apparatus of claim 1, wherein:
the control circuit is configured to program memory cells in an order starting with memory cells connected to a top word line and ending with memory cells connected to a bottom word line.

14. The apparatus of claim 1, wherein:
the control circuit is configured to program memory cells in an order starting with memory cells connected to a bottom word line and ending with memory cells connected to a top word line.

15. The apparatus of claim 1, wherein the control circuit is further configured to start programming to a fourth set of data states for the non-volatile memory cells connected to the first word line after completing programming to the third set of data states for the non-volatile memory cells connected to the first word line, the third set of data states are higher in threshold voltage than the fourth set of data states.

16. A method, comprising:
completing programming to a first set of data states prior to starting programming to a second set of data states for non-volatile memory cells connected to a first word line, the first set of data states are higher in threshold voltage than the second set of data states;
after completing programming to the first set of data states for non-volatile memory cells connected to the first word line and prior to starting programming to the second set of data states for non-volatile memory cells connected to the first word line, completing programming to the first set of data states prior to starting programming to the second set of data states for non-volatile memory cells connected to a second word line;
after completing programming to the first set of data states for non-volatile memory cells connected to the second word line and prior to starting programming to the second set of data states for the non-volatile memory cells connected to the second word line, performing programming to the second set of data states for non-volatile memory cells connected to the first word line; and
after completing programming to the second set of data states for non-volatile memory cells connected to the first word line, performing programming to the second set of data states for non-volatile memory cells connected to the second word line.

17. The method of claim 16, further comprising:
after completing programming to the second set of data states for non-volatile memory cells connected to the second word line, performing programming to a third set of data states for non-volatile memory cells connected to the first word line, the second set of data states are higher in threshold voltage than the third set of data states; and
after completing programming to the third set of data states for non-volatile memory cells connected to the first word line, performing programming to the third set of data states for non-volatile memory cells connected to the second word line.

18. The method of claim 16, further comprising:
programming to the first set of data states for non-volatile memory cells connected to a third word line of the set of word lines after completing programming to the second set of data states for non-volatile memory cells connected to the first word line and before programming to the second set of data states for non-volatile memory cells connected to the second word line;
after completing programming to the second set of data states for non-volatile memory cells connected to the second word line, performing programming to a third set of data states for non-volatile memory cells connected to the first word line, the second set of data states are higher in threshold voltage than the third set of data states' programming to the first set of data states for non-volatile memory cells connected to a fourth word line of the set of word lines after completing programming to the third set of data states for non-volatile memory cells connected to the first word line;
after completing programming to the first set of data states for non-volatile memory cells connected to the fourth word line, programming to the second set of data states for non-volatile memory cells connected to the third word line;
programming to the third set of data states for non-volatile memory cells connected to the second word line after completing programming to the second set of data states for non-volatile memory cells connected to the third word line;
programming to the first set of data states for non-volatile memory cells connected to a fifth word line of the set of word lines after completing programming to the third set of data states for non-volatile memory cells connected to the second word line;
programming to the second set of data states for non-volatile memory cells connected to the fourth word line after completing programming to the first set of data states for non-volatile memory cells connected to the fifth word line; and
programming to the third set of data states for non-volatile memory cells connected to the third word line after completing programming to the second set of data states for non-volatile memory cells connected to the fourth word line.

19. An apparatus, comprising:
a non-volatile memory structure comprising a first plurality of non-volatile memory cells connected to a first word line; and
a control circuit connected to the non-volatile memory structure, the control circuit is configured to:
apply first voltage pulses to the first word line to program the first plurality of non-volatile memory cells to a first set of data states prior to starting programming of the plurality of non-volatile memory cells to a second set of data states, the first set of data states are higher in threshold voltage than the second set of data states, the first voltage pulses have an initial magnitude at a first voltage;

apply second voltage pulses to the first word line to program the first plurality of non-volatile memory cells to the second set of data states prior to starting programming of the plurality of non-volatile memory cells to a third set of data states, the second set of data states are higher in threshold voltage than the third set of data states, the second voltage pulses have an initial magnitude at a second voltage, the second voltage is less than the first voltage; and apply third voltage pulses to the first word line to program the first plurality of non-volatile memory cells to the third set of data states, the third voltage pulses have an initial magnitude at a third voltage, the third voltage is less than the second voltage.

20. The apparatus of claim 19, wherein:

the non-volatile memory structure further comprises additional non-volatile memory cells connected to additional word lines, the additional non-volatile memory cells are positioned in NAND strings;

the control circuit is configured to apply a first pass voltage to the additional word lines while applying the first voltage pulses to the first word line to program the plurality of non-volatile memory cells to the first set of data states;

the control circuit is configured to apply a second pass voltage to the additional word lines while applying the second voltage pulses to the first word line to program the plurality of non-volatile memory cells to the second set of data states, the second pass voltage is lower than the first pass voltage; and the control circuit is configured to apply a third pass voltage to the additional word lines while applying the third voltage pulses to the first word line to program the plurality of non-volatile memory cells to the first set of data states, the third pass voltage is lower than the second pass voltage.

* * * * *